United States Patent
Kwon

(10) Patent No.: US 10,068,624 B2
(45) Date of Patent: Sep. 4, 2018

(54) ELECTRONIC DEVICE AND OPERATING METHOD THEREOF

(71) Applicant: SK hynix Inc., Icheon-si Gyeonggi-do (KR)

(72) Inventor: Kyoung Han Kwon, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/703,077

(22) Filed: Sep. 13, 2017

(65) Prior Publication Data
US 2018/0226108 A1    Aug. 9, 2018

(30) Foreign Application Priority Data
Feb. 9, 2017  (KR) .......................... 10-2017-0018190

(51) Int. Cl.
*G11C 7/00*    (2006.01)
*G11C 7/10*    (2006.01)
*G11C 5/14*    (2006.01)

(52) U.S. Cl.
CPC ............ *G11C 7/1012* (2013.01); *G11C 7/106* (2013.01); *G11C 5/14* (2013.01)

(58) Field of Classification Search
CPC .... G11C 7/10; G11C 2207/107; G11C 7/1006
See application file for complete search history.

(56) References Cited

U.S. PATENT DOCUMENTS

| | | | | |
|---|---|---|---|---|
| 5,799,209 A | * | 8/1998 | Chatter | G11C 7/1075 710/2 |
| 7,475,187 B2 | * | 1/2009 | Gregorius | G11C 7/1006 711/104 |
| 8,996,785 B2 | * | 3/2015 | Lee | G11C 16/32 711/103 |
| 2007/0073942 A1 | * | 3/2007 | Gregorius | G11C 7/1006 710/71 |
| 2008/0298159 A1 | * | 12/2008 | Kawabata | G11C 7/10 365/233.5 |
| 2010/0157644 A1 | * | 6/2010 | Norman | G11C 5/00 365/51 |
| 2012/0079352 A1 | * | 3/2012 | Frost | G11C 7/1072 714/767 |
| 2017/0185297 A1 | * | 6/2017 | Kim | G11C 16/26 |

FOREIGN PATENT DOCUMENTS

KR    1020100131710 A    12/2010
KR    1020150143943 A    12/2015

* cited by examiner

*Primary Examiner* — Tuan T Nguyen
(74) *Attorney, Agent, or Firm* — William Park & Associates Ltd.

(57) ABSTRACT

According to an embodiment, a storage device may be provided. The storage device may include a semiconductor memory device, and a memory controller configured for controlling the semiconductor memory device. The semiconductor memory device may include a memory unit including a plurality of memory chips. The semiconductor memory device may include an interface chip realigning serial data received from the memory controller into parallel data and transferring the parallel data to each of the plurality of memory chips.

20 Claims, 25 Drawing Sheets

ELECTRONIC DEVICE AND OPERATING METHOD THEREOF

CROSS-REFERENCE TO RELATED APPLICATION

The present application claims priority under 35 U.S.C. § 119(a) to Korean patent application number 10-2017-0018190 filed on Feb. 9, 2017, in the Korean Intellectual Property Office, the entire disclosure of which is incorporated by reference herein.

BACKGROUND

1. Technical Field

Various embodiments may generally relate to an electronic device and, more particularly, to a storage device and an operating method thereof.

2. Related Art

A storage device may store data in response to control of a host device, such as a computer, a smartphone, and a smartpad. This storage device may include a device which stores data in a magnetic disk, such as a hard disk drive (HDD), and a device which stores data in a semiconductor memory, especially in a non-volatile memory, such as a solid state drive (SSD), or a memory card.

Nonvolatile memories may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM).

In line with the development of semiconductor manufacturing technologies, storage devices with high capacity and high speed have been developed. High capacity storage devices are manufactured by increasing the degree of integration of semiconductor memory chips and overlapping a plurality of semiconductor memory chips.

However, high capacity and high speed may deteriorate the reliability of storage devices. For example, as the number of semiconductor chips overlapped with each other increases, resistive components generated by the semiconductor chips may increase. The increase in the resistive components may result in a decrease in toggle speed of a channel communicating with the semiconductor chips. The decrease in toggle speed may increase skew. In addition, a substrate with a more complicated design causes manufacturing costs to increase, and power consumption to increase. Therefore, because of the high speeds and high capacities of the storage devices methods of manufacturing a storage device having improved reliability is needed.

SUMMARY

According to an embodiment, a storage device may be provided. The storage device may include a semiconductor memory device. The storage device may include a memory controller configured for controlling the semiconductor memory device. The semiconductor memory device may include a memory unit including a plurality of memory chips. The semiconductor memory device may include an interface chip realigning serial data received from the memory controller into parallel data and transferring the parallel data to each of the plurality of memory chips.

DETAILED DESCRIPTION

Figure 1:
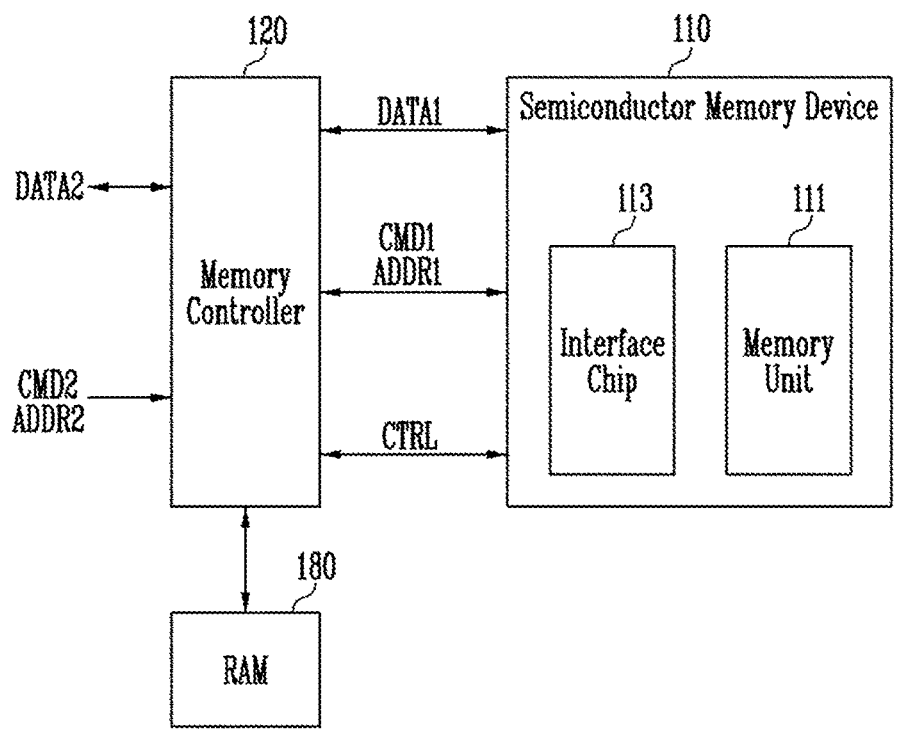
FIG. 1 is a block diagram illustrating a storage device according to an embodiment.

Hereinafter, various examples of embodiments will be described with reference to the accompanying drawings.

The figures are provided to allow those with ordinary skill in the art to understand the scope of the embodiments. The examples used herein are intended merely to facilitate an understanding of ways in which the disclosure may be practiced and to further enable those of skill in the art to practice the embodiments of the disclosure. The present embodiments may, however, be embodied in different forms and should not be construed as limited to the embodiments set forth. Rather, these embodiments are provided so that this disclosure will be thorough and complete.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

Furthermore, 'connected/coupled' represents that one component is directly electrically coupled to another component or indirectly electrically coupled through another component. A singular form may include a plural form as long as it is not specifically mentioned in a sentence. Furthermore, 'include/comprise' or 'including/comprising' used in the specification represents that one or more components, steps, operations, and elements exists or have been added. Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be illustrated in the drawings and described in the specification. However, the examples of embodiments according to the concepts are not limited to the specific embodiments, but include all changes, equivalents, or alternatives which are included in the spirit and technical scope of the present disclosure.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

Descriptions of well-known components and processing techniques may be omitted to not unnecessarily obscure the embodiments of the disclosure.

Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Further, the logic levels of the signals may be different from or the opposite of those described. For example, a signal described as having a logic "high" level may alternatively have a logic "low" level, and a signal described as having a logic "low" level may alternatively have a logic "high" level.

Hereinafter, the present disclosure will be described by explaining examples of embodiments with reference to the accompanying drawings.

Various embodiments may relate to a storage device having improved reliability and an operating method thereof.

FIG. 1 is a block diagram illustrating a storage device 100 according to an embodiment.

Referring to FIG. 1, the storage device 100 may include a semiconductor memory device 110, a memory controller 120 and a random access memory (RAM) 180.

The semiconductor memory device 110 may perform write, read, and erase operations in response to control the memory controller 120. The semiconductor memory device 110 may exchange first data DATA1 with the memory controller 120. For example, the semiconductor memory device 110 may receive write data from the memory controller 120 and write the write data. The semiconductor memory device 110 may perform a read operation and output read data to the memory controller 120.

The semiconductor memory device 110 may receive a first command CMD1 and a first address ADDR1 from the memory controller 120. According to an embodiment, the semiconductor memory device 110 may exchange a control signal CTRL with the memory controller 120. For example, the semiconductor memory device 110 may receive from the memory controller 120, one of a chip selection enable signal /CE for selecting a memory unit 111 constituting the semiconductor memory device 110, a command latch enable signal CLE indicating that the first command CMD1 is received from the memory controller 120 is, an address latch enable signal ALE indicating that the first address ADDR1 is received from the memory controller 120, a read enable signal /RE generated by the memory controller 120 during a read operation and used to match timing since the read enable signal /RE is periodically toggled, a write enable signal /WE activated by the memory controller 120 when the first command CMD1 or the first address ADDR1 is transferred, a write prevention signal /WP activated by the memory controller 120 to prevent inadvertent read or erase when a power supply is changed, and a data strobe signal DQS generated by the memory controller 120 during a read and used to match input sync of the first data DATA1 since the read enable signal /RE is periodically toggled.

According to an embodiment, the semiconductor memory device 110 may output to the memory controller 120, at least one of a ready and busy signal R/nB that indicates which operation, among read, write, and erase operations, is performed by the semiconductor memory device 110, and the data strobe signal DQS generated from the read enable signal /RE received from the memory controller 120 by the semiconductor memory device 110 and used to match output sync of the first data DATA1 since the data strobe signal DQS is periodically toggled.

The semiconductor memory device 110 may include the memory unit 111 and the interface chip 113. The memory unit 111 may communicate with the memory controller 120 through the interface chip 113. The interface chip 113 may interface communications between the memory unit 111 and the memory controller 120.

According to an embodiment, the interface chip 113 may perform various functions. For example, when the interface chip 113 interfaces communications between the memory controller 120 operating at high frequency and the memory unit 111 operating at low frequency, the interface chip 113 may perform a data realignment function. In another example, the interface chip 113 may perform a data retiming function when the interface chip 113 interfaces communications between the memory controller 120 operating at high frequency and the memory unit 111 operating at high frequency. In another example, when the interface chip 113 interfaces communications between the memory controller 120 driven at a low voltage of 1.2V and the memory unit 111 driven at a relatively high voltage of 1.8V, the interface chip 113 may function as a voltage converter. When the interface chip 113 interfaces communications between the memory controller 120 operating at low frequency and the memory unit 111 operating at low frequency, the interface chip 113 may function simply as a bypass chip which couples the memory unit 111 and the memory controller 120.

The semiconductor memory device 110 may include a nonvolatile memory. For example, the semiconductor memory device 110 may include a flash memory. However, the semiconductor memory device 110 is not limited to the flash memory. The semiconductor memory device 110 may include at least one of various nonvolatile memories such as a phase-change RAM (PRAM), a magnetic RAM (MRAM), a resistive RAM (RRAM), and a ferroelectric RAM (FeRAM).

The memory controller 120 may be configured to control the semiconductor memory device 110. For example, the memory controller 120 may control the semiconductor memory device 110 to perform a write, read, or erase operation. The memory controller 12 may exchange the first data DATA1 and the control signal CTRL with the semiconductor memory device 110 and output the first command CMD1 and the first address ADDR1 to the semiconductor memory device 110.

The memory controller 120 may control the semiconductor memory device 110 in response to control of an external host device (not illustrated). The memory controller 120 may exchange second data DATA2 with the host device and receive a second command CMD2 and a second address ADDR2 from the host device.

For example, the memory controller 120 may exchange the first data DATA1 with the semiconductor memory device 110 on the basis of a first unit and exchange the second data DATA2 with the host device on the basis of a second unit different from the first unit.

According to an embodiment, the memory controller 120 may exchange the first data DATA1 with the semiconductor memory device 110 according to a first format, and transfer the first command CMD1 and the first address ADDR1 to the semiconductor memory device 110. The memory controller 120 may exchange the second data DATA2 with the host device according to a second format different from the first format and receive the second command CMD2 and the second address ADDR2 from the host device.

The memory controller 120 may use the RAM 180 as a buffer memory, a cache memory, or an operation memory. For example, the memory controller 120 may receive the second data DATA2 from the host device, store the received second data DATA2 in the RAM 180, and write the second data DATA2 stored in the RAM 180 as the first data DATA1 into the semiconductor memory device 110. The memory controller 120 may receive the first data DATA1 from the semiconductor memory device 110, store the received first data DATA1 in the RAM 180, and output the first data DATA1 stored in the RAM 180 as the second data DATA2 to the host device. The memory controller 120 may store data read from the semiconductor memory device 110 in the RAM 180 and write the data stored in the RAM 180 into the semiconductor memory device 110 again.

The memory controller 120 may store data or codes necessary for managing the semiconductor memory device 110 in the RAM 180. For example, the memory controller 120 may be driven by reading the data or the codes necessary for managing the semiconductor memory device 110 from the semiconductor memory device 110 and loading the data or the codes to the RAM 180.

The RAM 180 may includes at least one of various random access memories such as dynamic RAM (DRAM), static RAM (SRAM), synchronous DRAM (SDRAM), phase-change RAM (PRAM), magnetic RAM (MRAM), resistive RAM (RRAM), and ferroelectric RAM (FeRAM).

The storage device 100 may write, read or erase data in response to a request from the host device. The storage device 100 may include a solid state drive (SSD) or a hard disk drive (HDD). The storage device 100 may include memory cards such as personal computer (PC) memory card international association (PCMCIA), a compact flash card (CF), a smart media card (SM, SMC), a memory stick, a multimedia card (MMC, RS-MMC, MMCmicro), an SD card (SD, miniSD, microSD, SDHC), a universal serial bus (USB) memory card, and a universal flash storage (UFS). The storage device 100 may include a mounted memory such as an embedded MultiMedia card (eMMC), UFS, and perfect page new (PPN).

Figure 2:
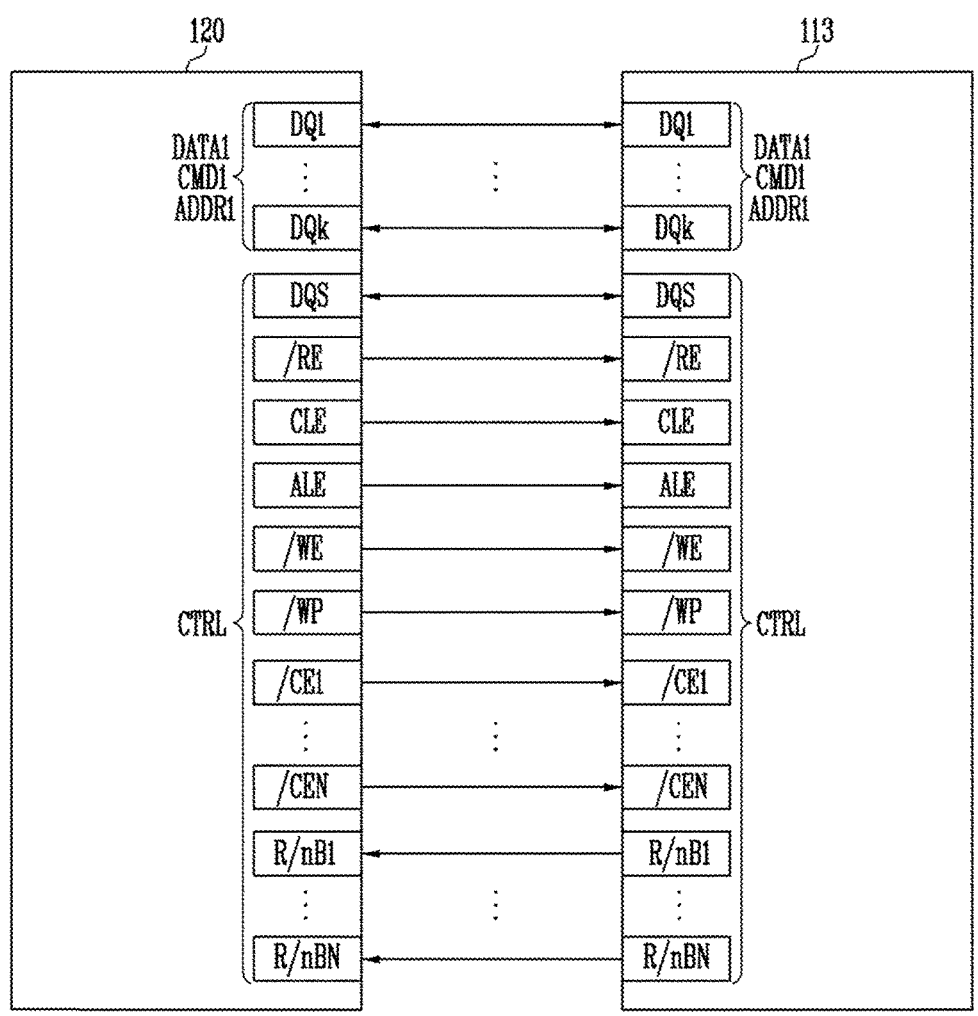
FIG. 2 is a block diagram illustrating the connection relationship between a memory controller and an interface chip.

FIG. 2 is a block diagram illustrating the connection relationship between the memory controller 120 and the interface chip 113.

Referring to FIG. 2, the memory controller 120 and the interface chip 113 may exchange the first data DATA1, the first command CMD1, and the first address ADDR1 through a common channel. Each of the memory controller 120 and the interface chip 113 may include first to kth input and output (input/output) pads DQ1 to DQk. The memory controller 120 and the interface chip 113 may exchange the first data DATA1, the first command CMD1, and the first address ADDR1 through the first to kth input/output pads DQ1 to DQk. For example, a signal transferred through each of the first to kth input/output pads DQ1 to DQk may be identified as one of the first data DATA1, the first command CMD1, and the first address ADDR1 according to the form of the control signal CTRL. For example, there may be eight, sixteen, or thirty-two first to kth input/output pads DQ1 to DQk. However, the number of input/output pads is not limited thereto.

The memory controller 120 and the interface chip 113 may exchange the control signal CTRL. Each of the memory controller 120 and the interface chip 113 may include a plurality of pads exchanging the data strobe signal DQS, the read enable signal /RE, the command latch enable signal CLE, the address latch enable signal ALE, the write enable signal /WE, the write prevention signal /WP, first to nth chip enable signals /CE1 to /CEN, and first to Nth ready and busy signals R/nB1 to R/nBN.

For example, when the memory controller 120 activates one of the chip enable signals /CE1 to /CEN (e.g., logic low), activates the command latch enable signal CLE (e.g., logic high), deactivates address latch enable signal ALE (e.g., logic low), and activates (e.g., logic low) and subsequently deactivates the write enable signal /WE (e.g., logic high), the memory controller 120 may output the first command CMD1 through the first to kth input/output pads DQ1 to DQk. In addition, it may be recognized that the interface chip 113 or the memory unit 111 receives the first command CMD1 through the first to kth input/output pads DQ1 to DQk.

For example, when the memory controller 120 activates one of the chip enable signals /CE1 to /CEN (e.g., logic low), deactivates the command latch enable signal CLE (e.g., logic low), activates the address latch enable signal ALE (e.g., logic high), and activates (e.g., logic low) and subsequently deactivates the write enable signal /WE (e.g., logic high), the memory controller 120 may output the first address ADDR1 through the first to kth input/output pads DQ1 to DQk. In addition, it may be recognized that the interface chip 113 or the memory unit 111 receives the first address ADDR1 through the first to kth input/output pads DQ1 to DQk.

For example, when the memory controller 120 activates one of the chip enable signals /CE1 to /CEN (e.g., logic low), deactivates the command latch enable signal CLE (e.g., logic low), deactivates the address latch enable signal ALE (e.g., logic low), deactivates the write enable signal /WE (e.g., logic high), and deactivates the read enable signal /RE (e.g., logic high), the memory controller 120 may generate the periodically toggled data strobe signal DQS and output the first data DATA1 synchronized with the data strobe signal DQS through the first to kth input/output pads DQ1 to DQk. The interface chip 113 or the memory unit 111 may recognize that the first data DATA1 in synchronization with the data strobe signal DQS is received from the first to kth input/output pads DQ1 to DQk.

For example, the memory controller 120 may activate one of the chip enable signals /CE1 to /CEN (e.g., logic low), deactivate the command latch enable signal CLE (e.g., logic low), deactivate the address latch enable signal ALE (e.g., logic low), deactivate the write enable signal /WE (e.g., logic high), and periodically toggle the read enable signal /RE. The interface chip 113 or the memory unit 111 may generate the periodically toggled data strobe signal DQS from the periodically toggled read enable signal /RE. The interface chip 113 or the memory unit 111 may be synchronized with the data strobe signal DQS and output the first data DATA1 through the first to kth input/output pads DQ1 to DQk. It may be recognized that the memory controller 120 is synchronized with the data strobe signal DQS and receives the first data DATA1 through the first to kth input/output pads DQ1 to DQk.

Figure 3:
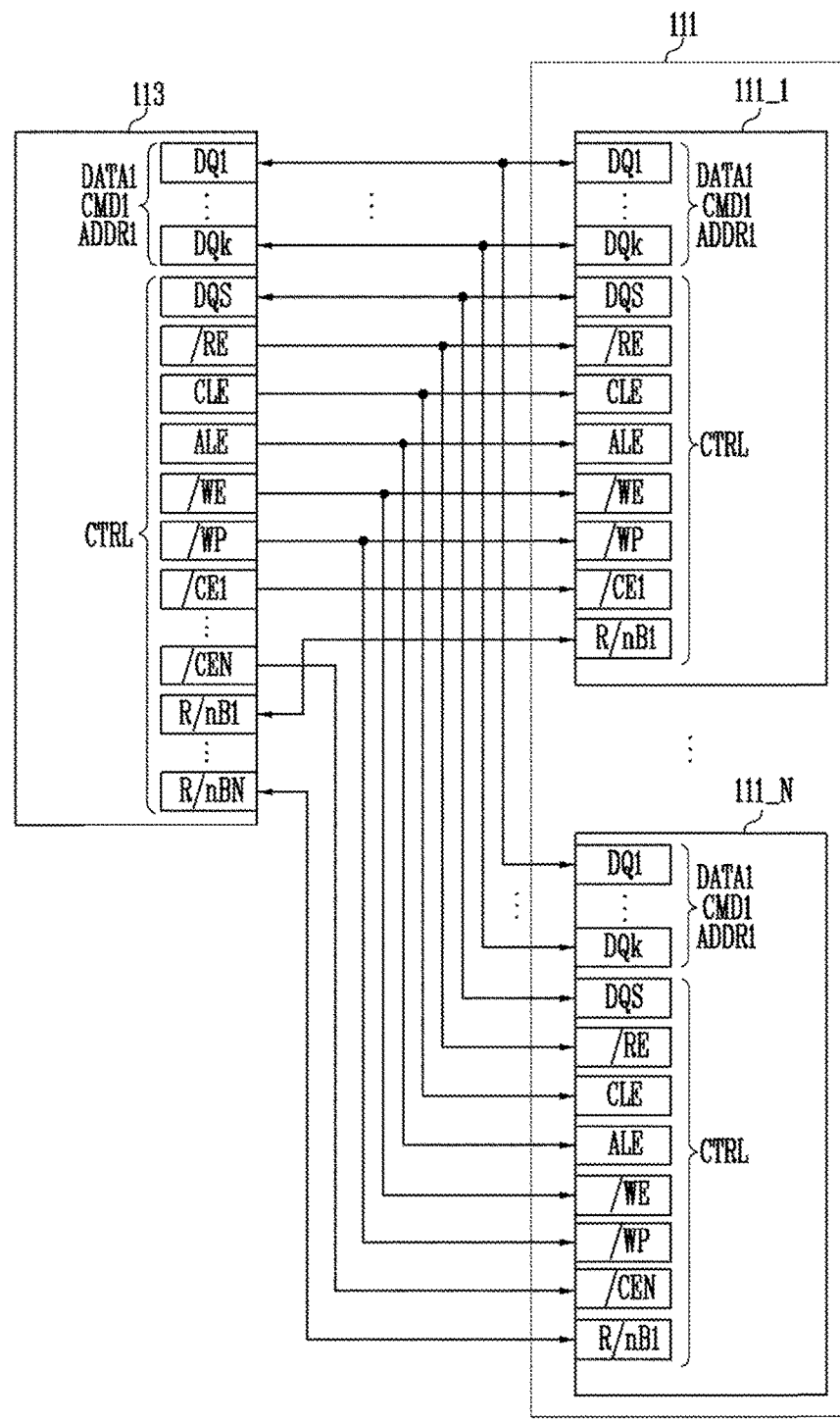
FIG. 3 is a block diagram illustrating the connection relationship between the interface chip and a memory unit.

FIG. 3 is a block diagram illustrating the connection relationship between the interface chip 113 and the memory unit 111.

Referring to FIG. 3, the memory unit 111 may include a plurality of memory chips 111_1 to 111_N. For example, each of the plurality of memory chips 111_1 to 111_N may be composed of a single semiconductor chip.

Each of the interface chip 113 and the plurality of memory chips 111_1 to 111_N may include the first to kth input/output pads DQ1 to DQk. The first to kth input/output pads DQ1 to DQk of the plurality of memory chips 111_1 to 111_N may be commonly connected to the first to kth input/output pads DQ1 to DQk of the interface chip 113. The interface chip 113 and the plurality of memory chips 111_1 to 111_N may exchange the first data DATA1, the first command CMD1 and the first address ADDR1 through the first to kth input/output pads DQ1 to DQk. For example, a signal transferred through each of the first to kth input/output pads DQ1 to DQk may be identified as the first data DATA1, the first command CMD1 or the first address ADDR1 according to the form of the control signal CTRL. For example, there may be eight, sixteen, or thirty-two first to kth input/output pads DQ1 to DQk. However, the number of input/output pads is not limited thereto.

The interface chip 113 and the plurality of memory chips 111_1 to 111_N may exchange the control signal CTRL.

The interface chip 113 may include a plurality of pads exchanging the data strobe signal DQS, the read enable signal /RE, the command latch enable signal CLE, the address latch enable signal ALE, the write enable signal /WE, the write prevention signal /WP, the first to Nth chip enable signals /CE1 to /CEN, and the first to Nth ready and busy signals R/nB1 to R/nBN.

Each of the plurality of memory chips 111_1 to 111_N may include a plurality of pads exchanging one of the data strobe signal DQS, the read enable signal /RE, the command latch enable signal CLE, the address latch enable signal ALE, the write enable signal /WE, the write prevention signal /WP, and the first to Nth chip enable signals /CE1 to /CEN, and one of the first to Nth ready and busy signals R/nB1 to R/nBN.

Each of the plurality of memory chips 111_1 to 111_N may exchange the data strobe signal DQS, the read enable signal /RE, the command latch enable signal CLE, the address latch enable signal ALE, the write enable signal /WE, and the write prevention signal /WP with the interface chip 113 through the common channel.

Each of the plurality of memory chips 111_1 to 111_N may receive one chip enable signal from the interface chip 113 and output one ready and busy signal to the interface chip 113. The plurality of memory chips 111_1 to 111_N may receive the chip enable signals /CE1 to /CEN from different pads of the interface chip 113, respectively. The plurality of memory chips 111_1 to 111_N may transfer the ready and busy signals R/nB1 to R/nBN to the different pads of the interface chip 113, respectively.

According to an embodiment, the plurality of memory chips 111_1 to 111_N sharing the common channel with the interface chip 113, i.e., the plurality of memory chips 111_1 to 111_N connected to the common channel may be stacked memory chips. The stacked memory chips 111_1 to 111_N may be divided into a single memory chip group. According to an embodiment, the interface chip 113 may communicate with two memory chip groups, i.e., a first memory chip group and a second memory chip group. Each of the first and second memory chip groups may include eight memory chips.

As described above with reference to FIGS. 2 and 3, the interface chip 113 may interface communications between the memory controller 120 and the plurality of memory chips 111_1 to 111_N. The interface chip 113 may realign the first data DATA1 received from the memory controller 120 and transfer the realigned data to the plurality of memory chips 111_1 to 111_N. The interface chip 113 may realign the first data DATA1 received from the plurality of memory chips 111_1 to 111_N and transfer the realigned data to the memory controller 120. The interface chip 113 may perform retiming while being shadowed during the communications between the memory controller 120 and the plurality of memory chips 111_1 to 111_N. Therefore, the interface chip 113 may improve the reliability of the storage device 100 without lowering an operating speed of the storage device 100.

Figure 4:
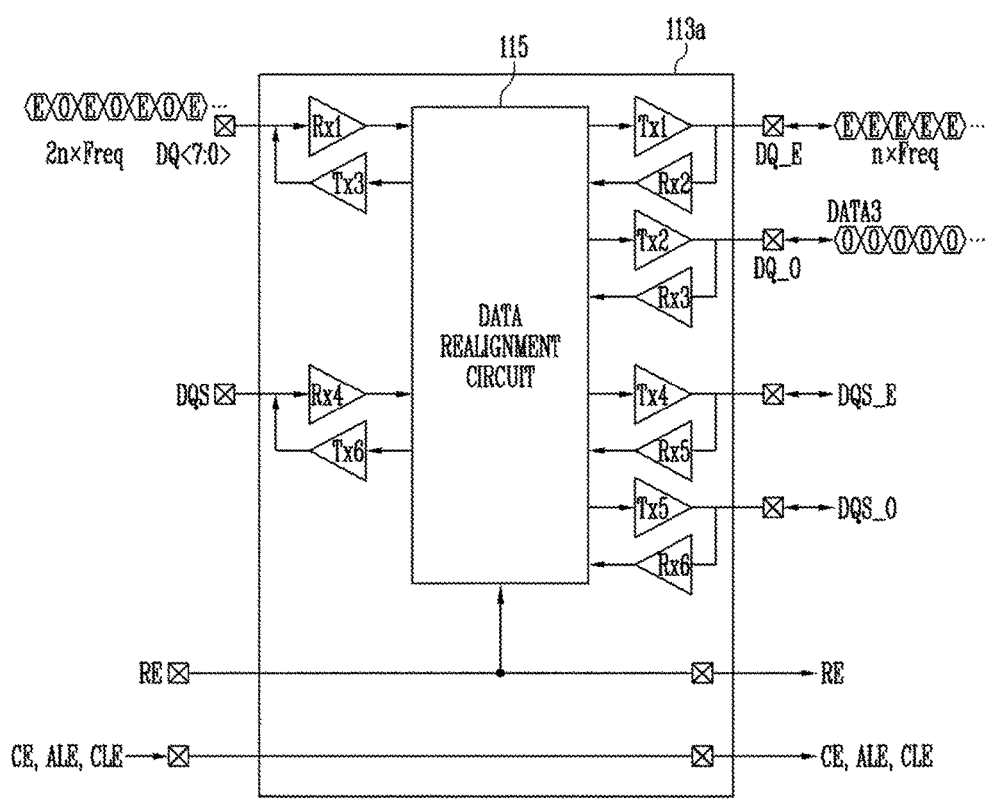
FIG. 4 is a diagram illustrating an interface chip according to an embodiment.

FIG. 4 is a diagram illustrating an interface chip 113a according to an embodiment.

Referring to FIG. 4, the interface chip 113a may include a data realignment circuit 115.

The interface chip 113a illustrated in FIG. 4 may interface communications between a memory controller operating at high frequency and a memory unit operating at low frequency. To be more specific, the interface chip 113a may communicate with the memory controller with a frequency of 2n×Freq and communicate with the memory unit with a frequency of n×Freq. The interface chip 113a may perform a data alignment operation. For example, the interface chip 113a may receive serial data from the memory controller during a write operation and in parallel transfer the serial data to two memory chips included in the memory unit at the same time.

For example, the interface chip 113a may receive write data from the memory controller through a first reception node Rx1. The write data received from the memory controller may be data where even data and odd data are sequentially repeated. The first reception node Rx1 may receive the write data (i.e., DQ<7:0>) through the first to kth input/output pads DQ1 to DQk as described above with reference to FIG. 2. For example, when receiving the write data through the first to kth input/output pads DQ1 to DQk, the interface chip 113a may receive a data strobe signal through a fourth reception node Rx4. The data strobe signal may be a first timing signal for storing the write data input through the first to kth input/output pads DQ1 to DQk.

The write data may be provided to the data realignment circuit 115. The data realignment circuit 115 may separate the even data from the odd data in the input write data. The separated even and odd data may be stored in an even memory chip and an odd memory chip, respectively.

The data strobe signal DQS input through the fourth reception node Rx4 may be provided to the data realignment circuit 115. The data realignment circuit 115 may generate a second timing signal that has a frequency of a half (½) of the frequency of the data strobe signal DQS. The data realignment circuit 115 may provide the even data and the odd data to the memory chips according to the second timing signal. For example, the even data DQ_E (i.e., even data bit E) separated by the data realignment circuit 115 may be provided to the even memory chip through a first transmission node Tx1. For example, the odd data DQ_O (i.e., odd data bit O) separated by the data realignment circuit 115 may be provided to the odd memory chip through a second transmission node Tx2. The second timing signal may be output to the even memory chip through a fourth transmission node Tx4 and to the odd memory chip through a fifth transmission node Tx5.

The interface chip 113a may simultaneously receive data in parallel from two memory chips, realign the data into serial data, and transfer the serial data to the controller during a read operation.

For example, the interface chip 113a may receive read data from the even memory chip and the odd memory chip through a second reception node Rx2 and a third reception node Rx3, respectively.

Each of the second reception node Rx2 and the third reception node Rx3 may receive the read data through the first to kth input/output pads DQ1 to DQk described above with reference to FIG. 3. The interface chip 113a may be synchronized with a third timing signal input through a fifth reception node Rx5 and a sixth reception node Rx6 and receive read data from the even memory chip and the odd memory chip through the second reception node Rx2 and the third reception node Rx3, respectively. According to an embodiment, the third timing signal may be data strobe signals DQS_E and DQS_O which are input from the even memory chip and the odd memory chip.

The data strobe signals DQS_E and DQS_O input from the even memory chip and the odd memory chip may be generated by the even memory chip and the odd memory chip, respectively, in response to a fourth timing signal input from the memory controller. According to an embodiment, the fourth timing signal may be an read enable signal RE signal (/RE) provided by the memory controller. According to an embodiment, a chip enable signal CE, an address latch enable signal, and a command latch enable signal may be provided by the memory controller.

The read data received from the even memory chip and the odd memory chip through the second reception node Rx2 and the third reception node Rx3 may be provided to the data realignment circuit 115. A third timing signal input through the fifth reception node Rx5 and the sixth reception node Rx6 may be provided to the data realignment circuit 115. According to an embodiment, the fourth timing signal may be provided to the data realignment circuit 115.

The data realignment circuit 115 may generate the serial data by storing even data and odd data to sequentially alternate with each other on the basis of the fourth timing signal in a register. The data realignment circuit 115 may transfer the stored serial data to the memory controller through the third transmission node Tx3 according to a sixth timing signal having a frequency two times greater than that of the third timing signal. The sixth timing signal may also be provided to the memory controller through the sixth transmission node Tx6.

According to an embodiment illustrated in FIG. 4, the data realignment circuit 115 may deserialize serial data into parallel data during a write operation and serialize parallel data received from each of the memory chips during a read operation, so that the data realignment circuit 115 may interface communications between the controller operating at high frequency and the memory chips at low frequency.

Figure 5:
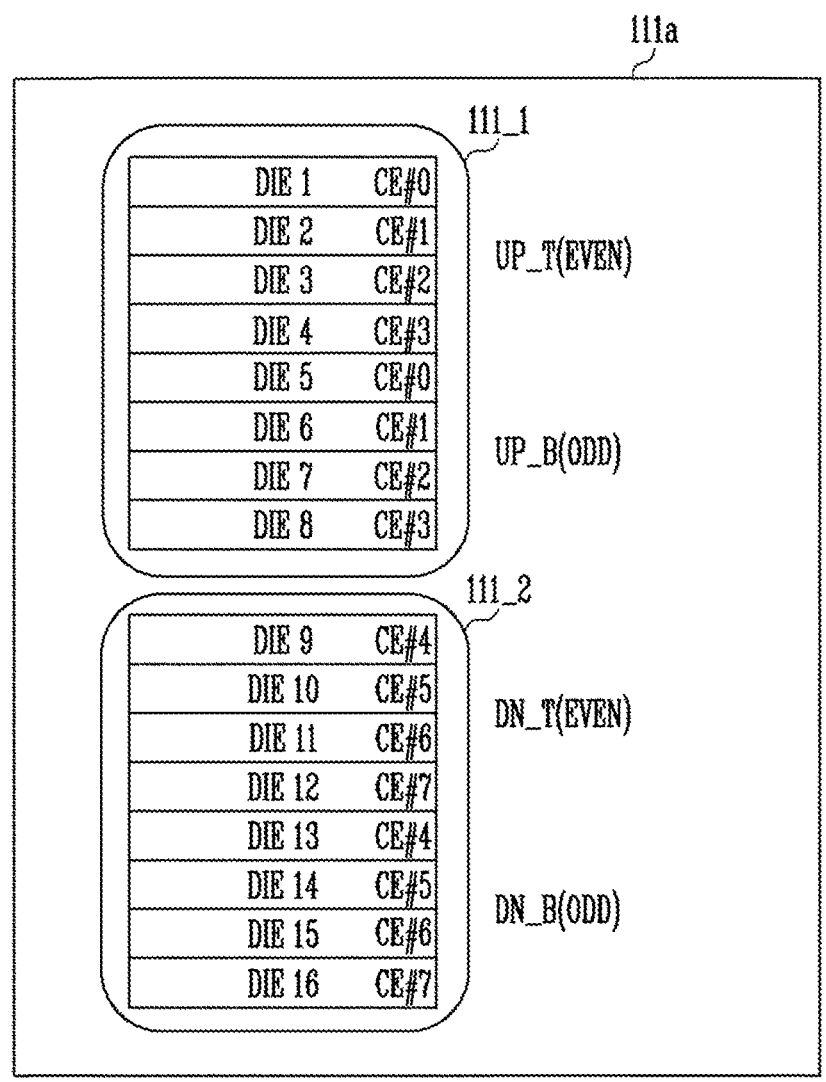
FIG. 5 is a diagram illustrating a memory unit according to an embodiment.

FIG. 5 is a view illustrating a memory unit 111a according to an embodiment.

Referring to FIG. 5, the memory unit 111a may include two memory chip groups 111_1 and 111_2. Each of the memory chip groups 111_1 and 111_2 may include a plurality of memory chips. A single memory chip may correspond to a single memory die. The terms "memory chip" and "die" are used interchangeably with each other.

The first memory chip group 111_1 may include first to eighth dies DIE1 to DIE8. The second memory chip group 111_2 may include ninth to sixteenth dies DIE9 to DIE16. The dies included in the first memory chip group 111_1 may have a stacked structure. The dies included in the second memory chip group 111_2 may have a stacked structure.

According to an embodiment, the first memory chip group 111_1 may be stacked over the second memory chip group 111_2. For example, the first die DIE1 and the sixteenth die DIE16 may be located at the top and bottom, respectively, and the second to fifteenth dies DIE2 to DIE15 may be sequentially stacked therebetween.

The first to fourth dies DIE1 to DIE4 included in the first memory chip group 111_1 may be dies UP_T(EVEN) located at a top portion of an upper stack and selected as dies for storing even memory. The fifth to eighth dies DIE5 to DIE8 included in the first memory chip group 111_1 may be dies UP_B(ODD) located at a lower portion of the upper stack and selected as dies for storing odd memory.

Ninth to twelfth dies DIE9 to DIE12 included in the second memory chip group 111_2 may be dies DN_T (EVEN) located at a top portion of a lower stack and selected as dies for storing even data.

Thirteenth to sixteenth dies DIE13 to DIE16 included in the second memory chip group 111_2 may be dies DN_B (ODD) located at a bottom portion of the lower stack and selected as dies for storing odd data.

Each of the dies may be selected by a chip enable signal CH# input from the memory controller or the interface chip. The chip enable signal being input may be applied to activate any one of Nos. 0 to 7 chip enable signals. At least one of the plurality of dies included in the memory unit 111a may be selected by the chip enable signal being input. According to an embodiment, two dies may be selected at the same time by a single chip enable signal. In other words, two dies may be commonly connected to the same chip enable signal line. For example, an odd memory chip and an even memory chip may be simultaneously selected by a single chip enable signal.

According to an embodiment, the number of memory chip groups and the number of dies included in the memory unit 111a as illustrated in FIG. 5 are determined for convenience of explanation. The embodiments not limited thereto and the number of memory chip groups and the number of dies included in the memory unit may be different.

Figure 6:
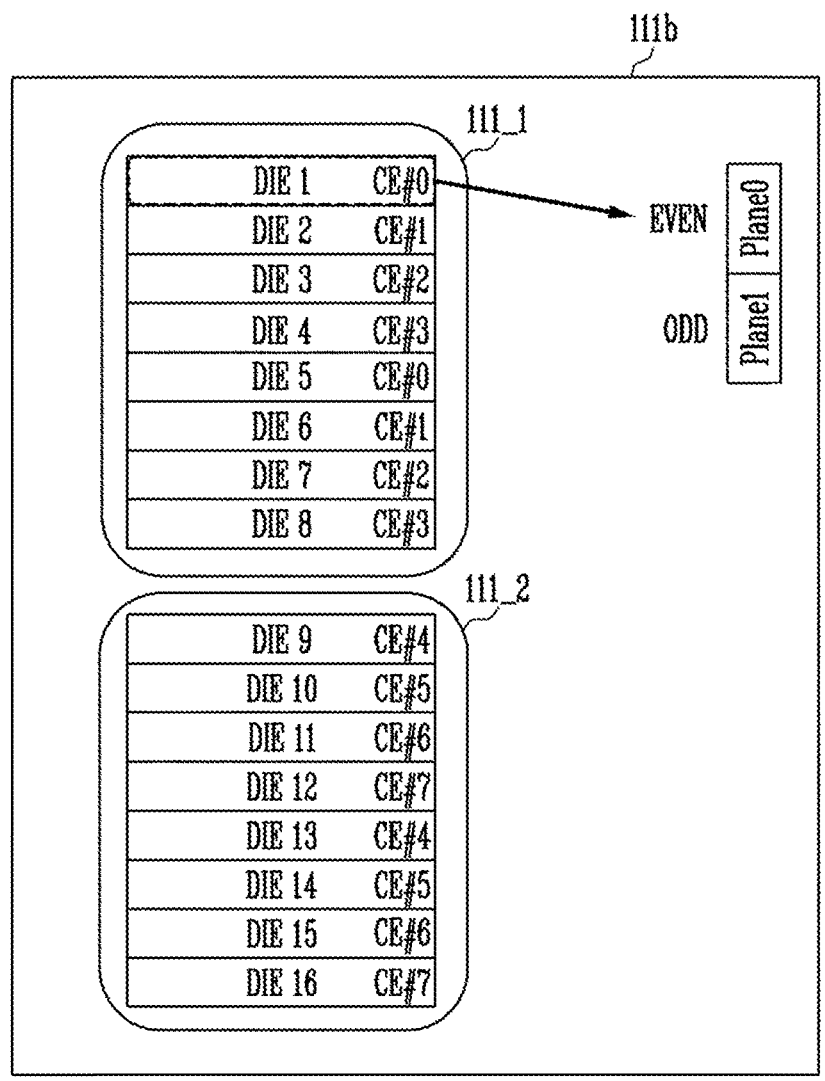
FIG. 6 is a diagram illustrating a memory unit according to an embodiment.

FIG. 6 is a diagram illustrating a memory unit 111b according to an embodiment.

Referring to FIG. 6, the memory unit 111b may include two memory chip groups. Each of the first and second memory chip groups 111_1 and 111_2 may include a plurality of memory chips. A single memory chip may correspond to a single memory die. The terms "memory chip" and "die" are interchangeably used with each other.

The first memory chip group 111_1 may include the first to eighth dies DIE1 to DIE8. The second memory chip group 111_2 may include the ninth to sixteenth dies DIE9 to DIE16. The dies included in the first memory chip group 111_1 may have a stacked structure. The dies includes included in the second memory chip group 111_2 may have a stacked structure.

According to an embodiment, the first memory chip group 111_1 may be stacked over the second memory chip group 111_2. For example, the first die DIE1 and the sixteenth die DIE16 may be located at the top and bottom, respectively, and the second to fifteenth dies DIE2 die DIE15 may be sequentially stacked therebetween. Therefore, the first memory chip group 111_1 may be the upper stack UP and the second memory chip group 111_2 may be the lower stack DN.

Unlike an embodiment illustrated in FIG. 5 where two dies are selected in response to a single chip enable signal, a single die may be selected in response to a single chip enable signal in an embodiment illustrated in FIG. 6. In addition, each die may include a plurality of planes. Even data may be stored in memory cells included in a zeroth plane plane0, and odd data may be stored in memory cells included in a first plane plane1.

According to an embodiment, the number of memory chip groups and the number of dies included in the memory unit 111a as illustrated in FIG. 6 are determined for purpose of explanation. The embodiments are not limited to FIG. 6 and the number of memory chip groups and the number of dies included in the memory unit may be different.

Figure 7:
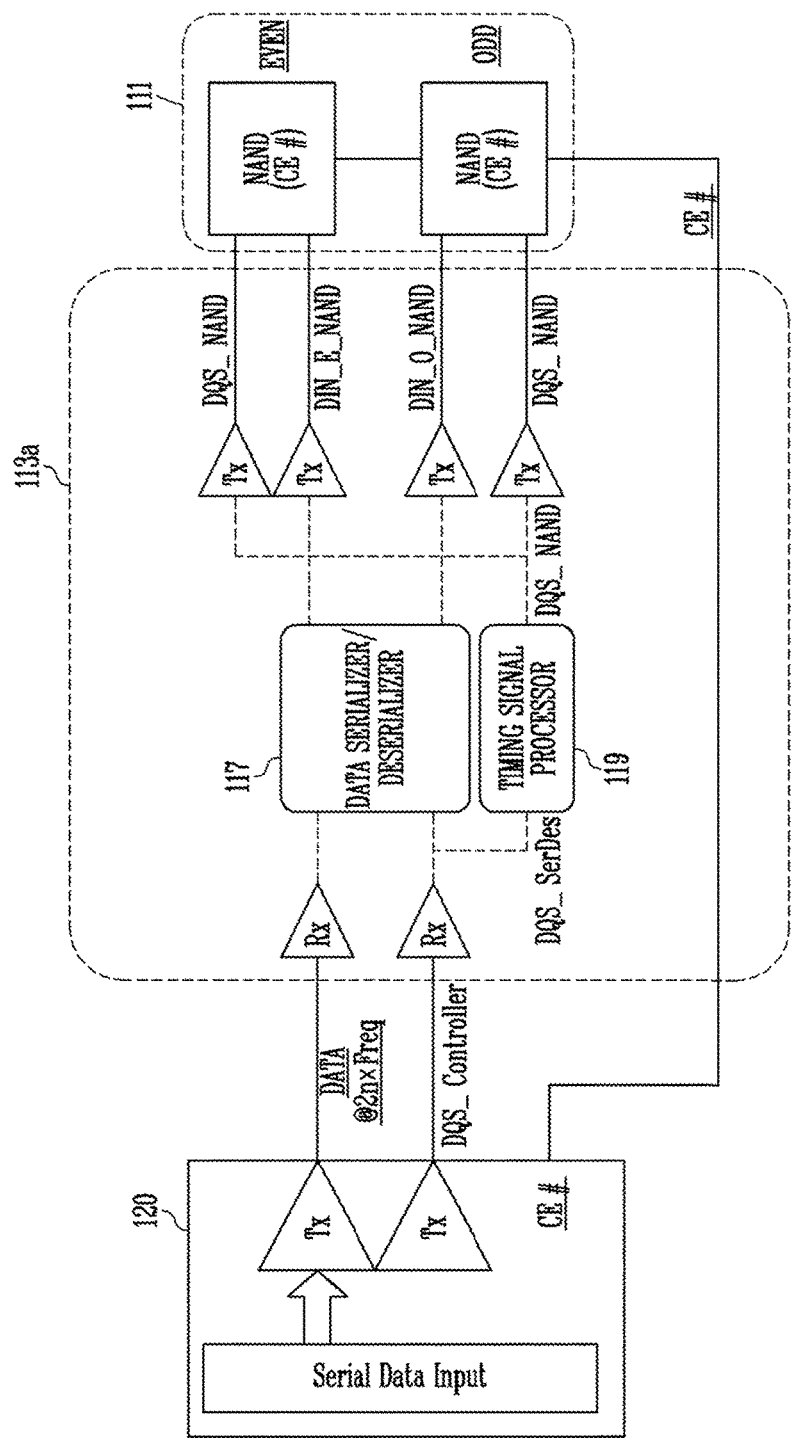
FIG. 7 is a diagram illustrating a write operation of an interface chip illustrated in FIG. 4.

FIG. 7 is a diagram illustrating a write operation of the interface chip 113a illustrated in FIG. 4.

Figure 8:
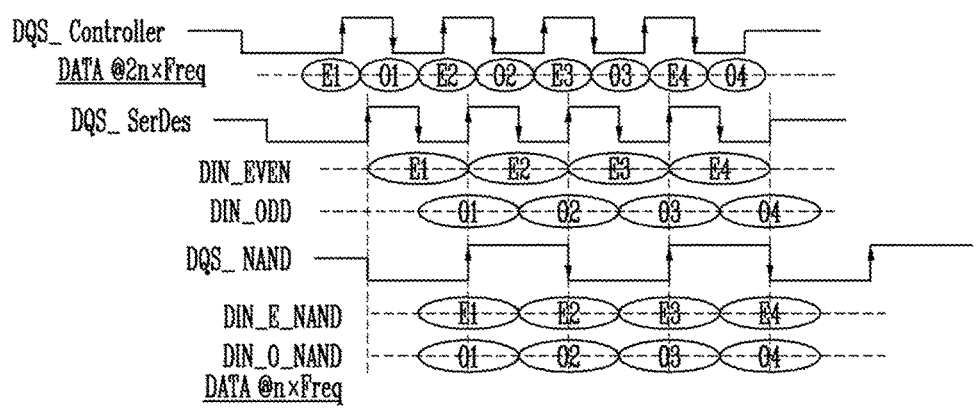
FIG. 8 is a timing diagram illustrating waveforms of signals used during the write operation of the interface chip illustrated in FIG. 4.

FIG. 8 is a timing diagram illustrating waveforms of signals used during the write operation of the interface chip 113a illustrated in FIG. 4.

Referring to FIGS. 7 and 8, the memory controller 120 may transfer write data DATA, which is serial data, to the interface chip 113a through a transmission node Tx during the write operation. The write data DATA may be synchronized with a data strobe signal DQS_Controller as a timing signal.

The interface chip 113a may include a data serializer and deserializer (serializer/deserializer) 117 and a timing signal processor 119.

The data serializer/deserializer 117 may receive the write data DATA through a reception node Rx.

The data serializer/deserializer 117 may separate the write data DATA, which is the serial data, into even data and odd data and realign the serial data into parallel data.

The timing signal processor 119 may receive the data strobe signal DQS_Controller through the reception node Rx. The data strobe signal DQS_Controller input to the timing signal processor 119 may be a data strobe signal DQS_SerDes which is delayed by a predetermined time or cycle from the data strobe signal DQS_Controller due to transmission delay. The timing signal processor 119 may provide the delayed data strobe signal DQS_SerDes to the data serializer/deserializer 117 so that the data serializer/deserializer 117 may realign the write data, which is the serial data, into the parallel data.

The data serializer/deserializer 117 may realign the write data, which is the serial data, into the parallel data by storing the even data in a first latch DIN_EVEN at a falling edge of the delayed data strobe signal DQS_SerDes and storing the odd data in a second latch DIN_ODD at a rising edge thereof.

The data serializer/deserializer 117 may synchronize even data (E1 to E4) of the first latch DIN_EVEN and odd data (O1 to O4) of the second latch DIN_ODD with a timing signal DQS_NAND generated by the timing signal processor 119 and transfer the even data and the odd data to the memory unit 111 through the transmission nodes Tx.

Two memory chips may be selected by a chip enable signal CE# output by the memory controller. Even data DIN_E_NAND synchronized with the timing signal DQS_NAND may be input to an even memory chip (i.e., NAND) selected by the chip enable signal CE# through the transmission node Tx. Odd data DIN_O_NAND synchronized with the timing signal DQS_NAND may be input to an odd memory chip (i.e., NAND) selected by the chip enable signal CE# through the transmission node Tx.

Figure 9:
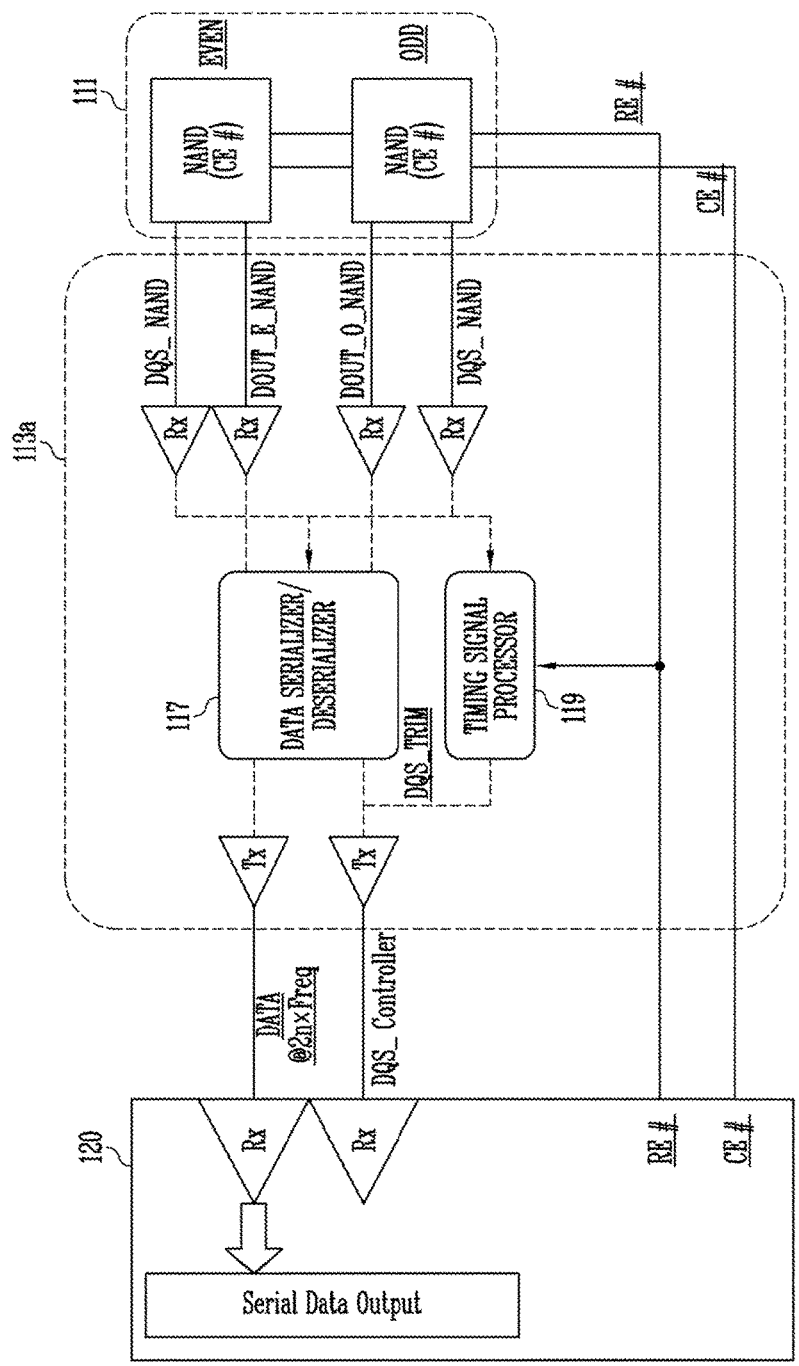
FIG. 9 is a diagram illustrating a read operation of the interface chip illustrated in FIG. 4.

FIG. 9 is a diagram illustrating a read operation of the interface chip 113a illustrated in FIG. 4.

Figure 10:
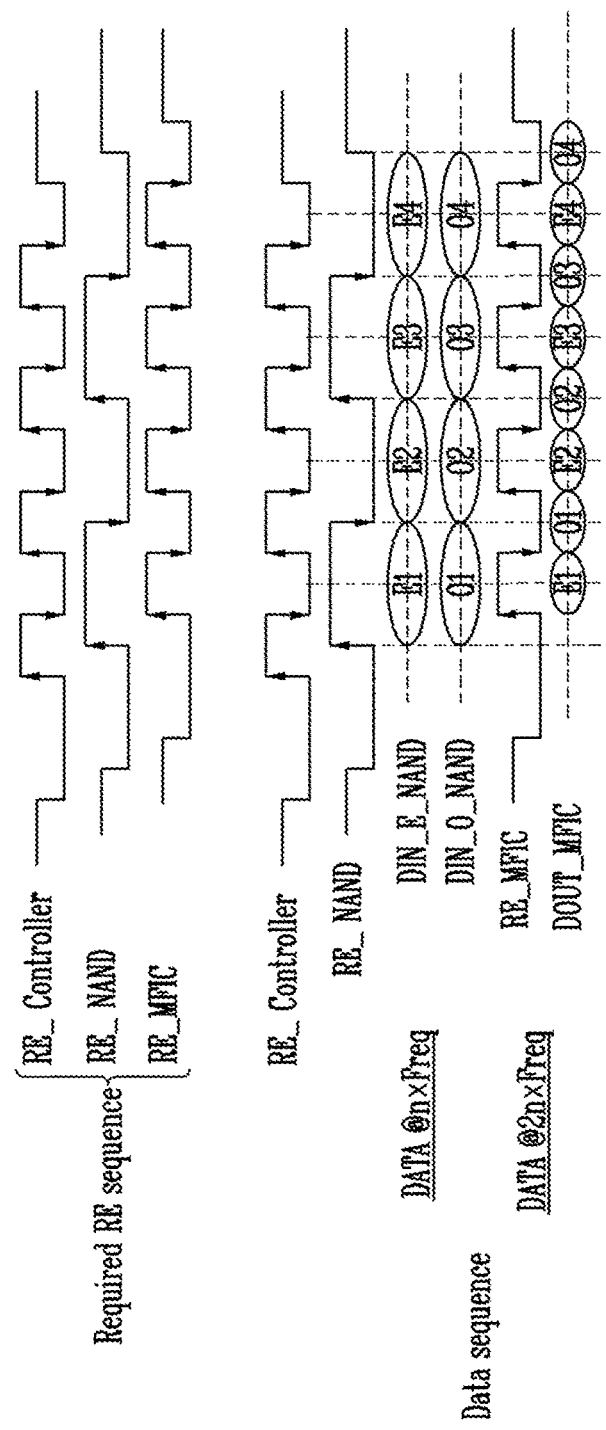
FIG. 10 is a timing diagram illustrating waveforms of signals used during a read operation of the interface chip illustrating in FIG. 4.

FIG. 10 is a timing diagram illustrating waveforms of signals used in the read operation of the interface chip 113*a* illustrated in FIG. 4.

Referring to FIGS. 9 and 10, during a read operation, the memory controller 120 may transfer to the interface chip 113*a*, the chip enable signal CE# corresponding to a memory chip (i.e., NAND) on which the read operation is performed. The interface chip 113*a* may provide the received chip enable signal CE# to the memory unit 111. An even memory chip EVEN and an odd memory chip ODD may be selected by the chip enable signal CE# at the same time.

The memory controller 120 may transfer a read enable signal RE# to the interface chip 113*a* in order to provide a timing signal with respect to the read operation. The interface chip 113*a* may provide the received read enable signal RE# to the memory unit 111.

During a read operation, the even memory chip EVEN and the odd memory chip ODD may receive the read enable signal RE# from the interface chip 113*a*. The even memory chip EVEN and the odd memory chip ODD may generate a data strobe signal DQS_NAND and transfer read data in synchronization with the generated data strobe signal DQS_NAND to the interface chip 113*a* in response to the received read enable signal RE#. A frequency of the data strobe signal DQS_NAND illustrated in FIG. 9 may be the same or half of the frequency as the read enable signal RE#. In FIG. 9, the data strobe signal DQS_NAND provided to the interface chip 113*a* by each of the even memory chip EVEN and the odd memory chip ODD may correspond to a signal RE_NAND illustrated in FIG. 10.

The interface chip 113*a* may include the data serializer/deserializer 117 and the timing signal processor 119.

The data serializer/deserializer 117 may receive even read data DOUT_E_NAND and odd read data DOUT_O_NAND, and the data strobe signal DQS_NAND from the even memory chip EVEN and the odd memory chip ODD, respectively, through the reception nodes Rx.

The data serializer/deserializer 117 may realign the even read data DOUT_E_NAND and the odd read data DOUT_O_NAND, which are parallel data, as read data (DATA, DATA_MFIC) as single serial data.

The timing signal processor 119 may receive the data strobe signal DQS_NAND through the reception node Rx. The timing signal processor 119 may provide the data strobe signal DQS_NAND and the read enable signal RE# to the data serializer/deserializer 117 so that the data serializer/deserializer 117 may realign the even read data DOUT_E_NAND and the odd read data DOUT_O_NAND, which are parallel data, into the read data (DATA, DATA_MFIC) which is serial data. In addition, the timing signal processor 119 may generate the timing signal DQS_Controller to transmit the serialized read data (DATA, DATA MFIC). According to an embodiment, the timing signal DQS_Controller may have a frequency two times greater than that of the data strobe signal DQS_NAND.

The data serializer/deserializer 117 may store even data and odd data in a register according to a timing signal RE_MFIC obtained by inverting the read enable signal RE# received from the memory controller 120. For example, the data serializer/deserializer 117 may input the even data to the register at a rising edge of the timing signal RE_MFIC and the odd data to the register at a falling edge of the timing signal RE_MFIC, to thereby generate read data which is serial data.

The data serializer/deserializer 117 may synchronize the serialized read data with the timing signal DQS_Controller generated by the timing signal processor 119 and transfer the data to the memory controller 120 through the transmission node Tx.

Figure 11:
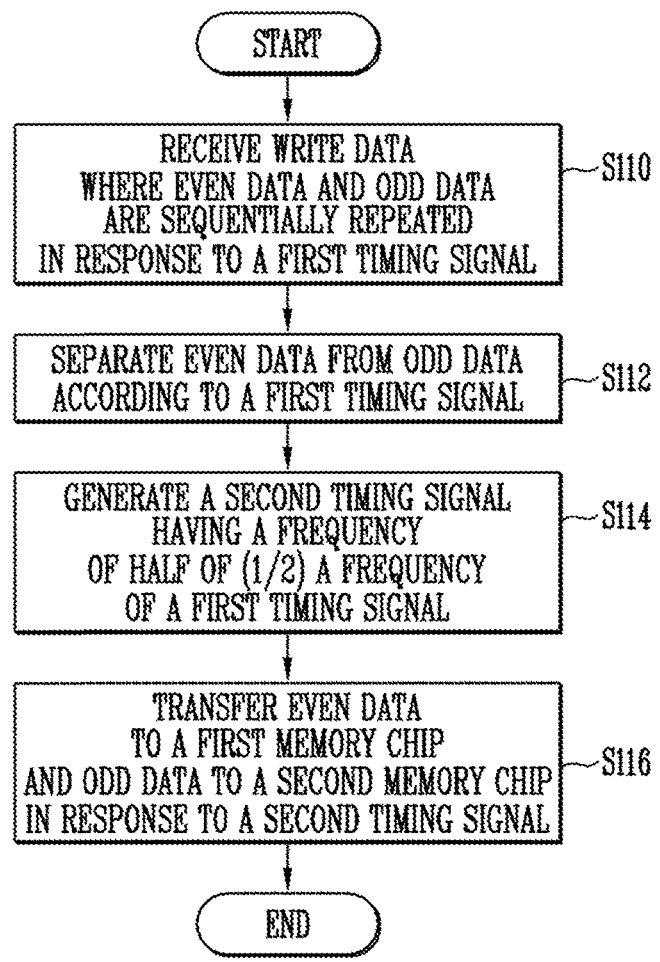
FIG. 11 is a flowchart illustrating a write operation of the interface chip illustrated in FIG. 4.

FIG. 11 is a flowchart illustrating a write operation of the interface chip 113*a* illustrated in FIG. 4.

Referring to FIG. 11, at step S110, the interface chip 113*a* may receive write data, which is serial data in which even data and odd data are sequentially repeated in response to the first timing signal. For example, the interface chip 113*a* may receive the write data DATA through the reception node Rx. According to an embodiment, the first timing signal may be a data strobe signal received from the memory controller.

At step S112, the interface chip 113*a* may separate the even data from the odd data according to the first timing signal. For example, the interface chip 113*a* may realign the write data, which is serial data, into parallel data by storing the even data in the first latch at a falling edge of the first timing signal and the odd data in the second latch at a rising edge thereof.

At step S114, the interface chip 113*a* may generate a second timing signal having a frequency of a half (½) of the frequency of the first timing signal. For example, the interface chip 113*a* may generate the second timing signal to transfer the deserialized even and odd data. According to an embodiment, the second timing signal may be a data strobe signal to be transferred to the memory chips.

At step S116, the interface chip 113*a* may transfer the even data to the first memory chip and the odd data to the second memory chip according to the second timing signal. According to an embodiment, the first memory chip may be an even memory chip and the second memory chip may be an odd memory chip. Alternatively, each of the first memory chip and the second memory chip may correspond to memory cells included in different planes included in a single memory chip.

Figure 12:
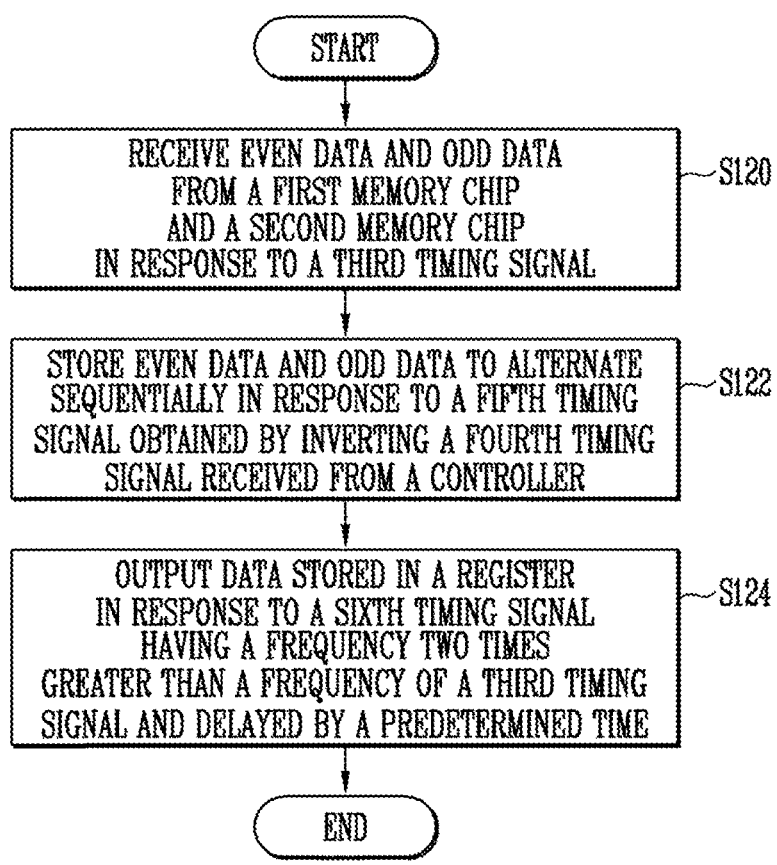
FIG. 12 is a flowchart illustrating a read operation of the interface chip illustrated in FIG. 4.

FIG. 12 is a flowchart illustrating a read operation of the interface chip 113*a* shown in FIG. 4.

Referring to FIG. 12, at step S120, the interface chip 113*a* may receive the even data and the odd data from the first memory chip and the second memory chip according to the third timing signal. The first memory chip may be an even memory chip and the second memory chip may be an odd memory chip. The third timing signal may be a data strobe signal transferred by each of the first and second memory chips in response to a read enable signal provided from the memory controller.

At step S122, the interface chip 113*a* may sequentially store the even data and the odd data in the register according to the fifth timing signal obtained by inverting the fourth timing signal received from the memory controller. According to an embodiment, the fourth timing signal may be a read enable signal #RE, and the fifth timing signal may be obtained by inverting the read enable signal #RE which is the fourth timing signal. For example, the interface chip 113*a* may store the even data and the odd data in the register according to the timing signal obtained by inverting the read enable signal RE# received from the memory controller. For example, the interface chip 113*a* may input the even data to the register at a rising edge of the timing signal and the odd data to the register at a falling edge thereof. In an embodiment, for example, the interface chip 113*a* may store even data and odd data to alternate sequentially in response to a fifth timing signal obtained by inverting a fourth timing signal received from the memory controller 120.

At step S124, the interface chip 113*a* may output the data stored in the register to the memory controller according to the sixth timing signal having a frequency two times greater than the frequency of the third timing signal and delayed by a predetermined time. According to an embodiment, the sixth timing signal may be a data strobe signal output from the interface chip 113a to the memory controller. The interface chip 113a may output the read data, which is serial data, to the memory controller according to the sixth timing signal.

Figure 13:
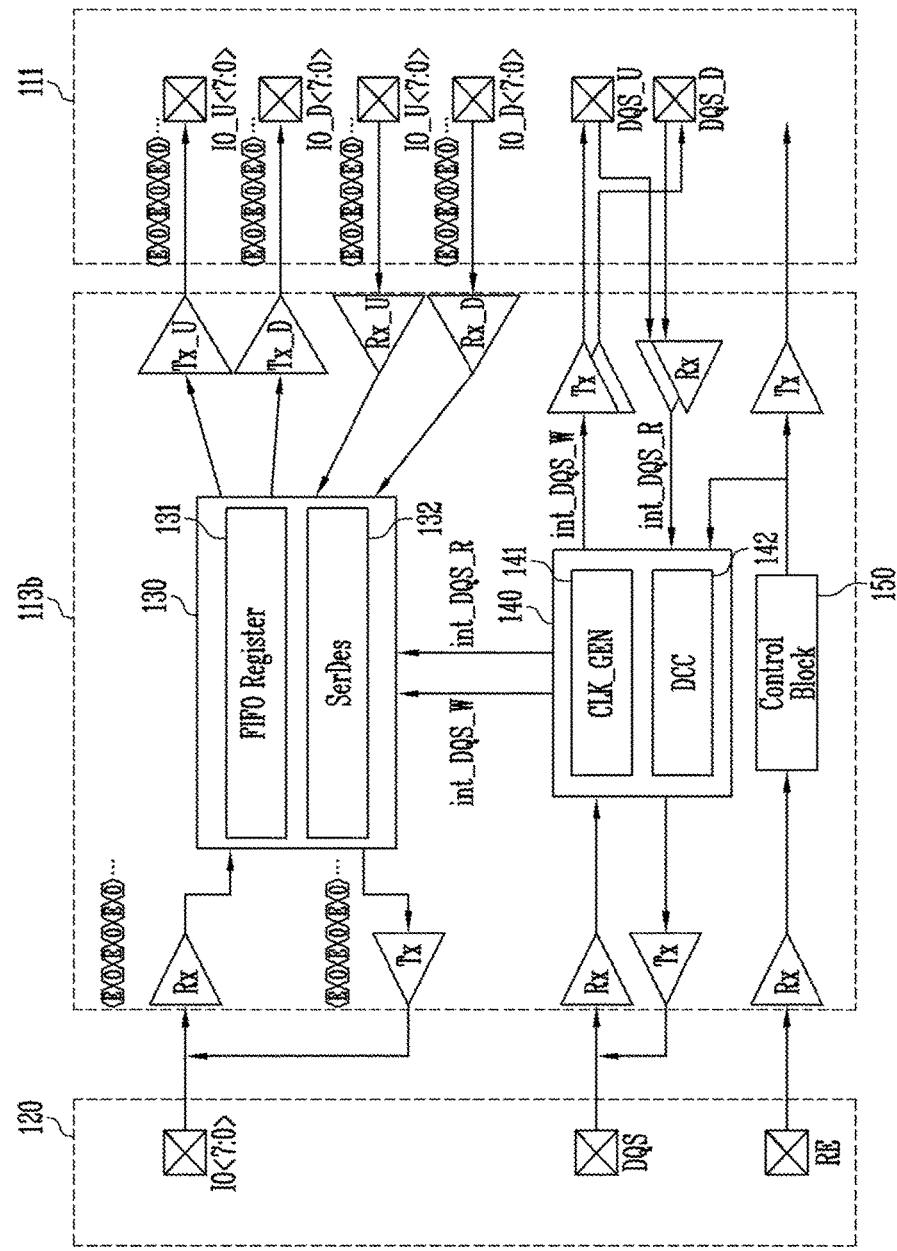
FIG. 13 is a diagram illustrating an interface chip according to an embodiment.

FIG. 13 is a diagram illustrating an interface chip 113b according to an embodiment.

Referring to FIG. 13, the interface chip 113b may perform a data retiming function to interface communications between the memory controller 120 operating at high frequency and the memory unit 111 operating at high frequency. The interface chip 113b may perform retiming with respect to the data exchanged between the memory controller 120 and the memory unit 111. The retiming may include buffering, i.e., storing and outputting data being transferred.

For example, the interface chip 113b may output the data received from the memory controller 120 to a plurality of memory chips and transfer the data received from the plurality of memory chips to the memory controller 120. Since the interface chip 113b interfaces communications between the plurality of memory chips and a single controller, loading of input and output (IO<7:0>) of the data may be increased, and reliability may be deteriorated.

Therefore, the interface chip 113b may include a separate clock generator CLK_GEN.

The interface chip 113b may include a data retiming unit 130, a timing signal control unit 140 and a control block 150.

The timing signal control unit 140 may further include a clock generator 141 and a duty cycle correction (DCC) 142.

The clock generator 141 may generate a clock signal having a predetermined frequency, and the DCC 142 may compensate for a duty cycle.

The control block 150 may process the read enable signal RE received from the memory controller 120 through a reception node Rx and provide the processed signal to the timing signal control unit 140 during a read operation.

The timing signal control unit 140 may generate an internal write strobe signal int_DQS_W on the basis of a clock signal generated by the clock generator 141 during a write operation. The timing signal control unit 140 may generate an internal read strobe signal int_DQS_R by using data strobe signals DQS_U and DQS_D received from a first memory chip U and a second memory chip D, respectively, during a read operation. In an embodiment, for example, the timing signal control unit 140 may receive and transmit a data strobe signal DQS from and to the memory controller 120 through a reception node Rx and a transmission node Tx, respectively.

The data retiming unit 130 may include a first in, first out (FIFO) register 131 and a Seriahzer and Deserializer (SerDes) 132. The data retiming unit 130 may separate the data input during the write operation into parallel data by the SerDes 132 and perform a retiming operation on the data according to the internal write strobe signal int_DQS_W provided by the timing signal control unit 140. Subsequently, the data retiming unit 130 may transfer data (IO_U<7:0> IO_D<7:0>) to each of the first memory chip U and the second memory chip D through the transmission nodes Tx_U and Tx_D, respectively. In an embodiment, for example, the data retiming unit 130 may receive serial data bits E and O through a receiving node RX.

During a read operation, the data retiming unit 130 may receive the data (IO_U<7:0> and IO_D<7:0>) from each of the first memory chip U and the second memory chip D through the reception nodes Rx_U and RX_D, respectively.

The data retiming unit 130 may realign the received data into serial data in the FIFO register 131 and transfer the data stored in the FIFO register 131 to the memory controller 120 through the transmission node Tx according to the internal read strobe signal int_DQS_R received from the timing signal control unit 140.

Figure 14:
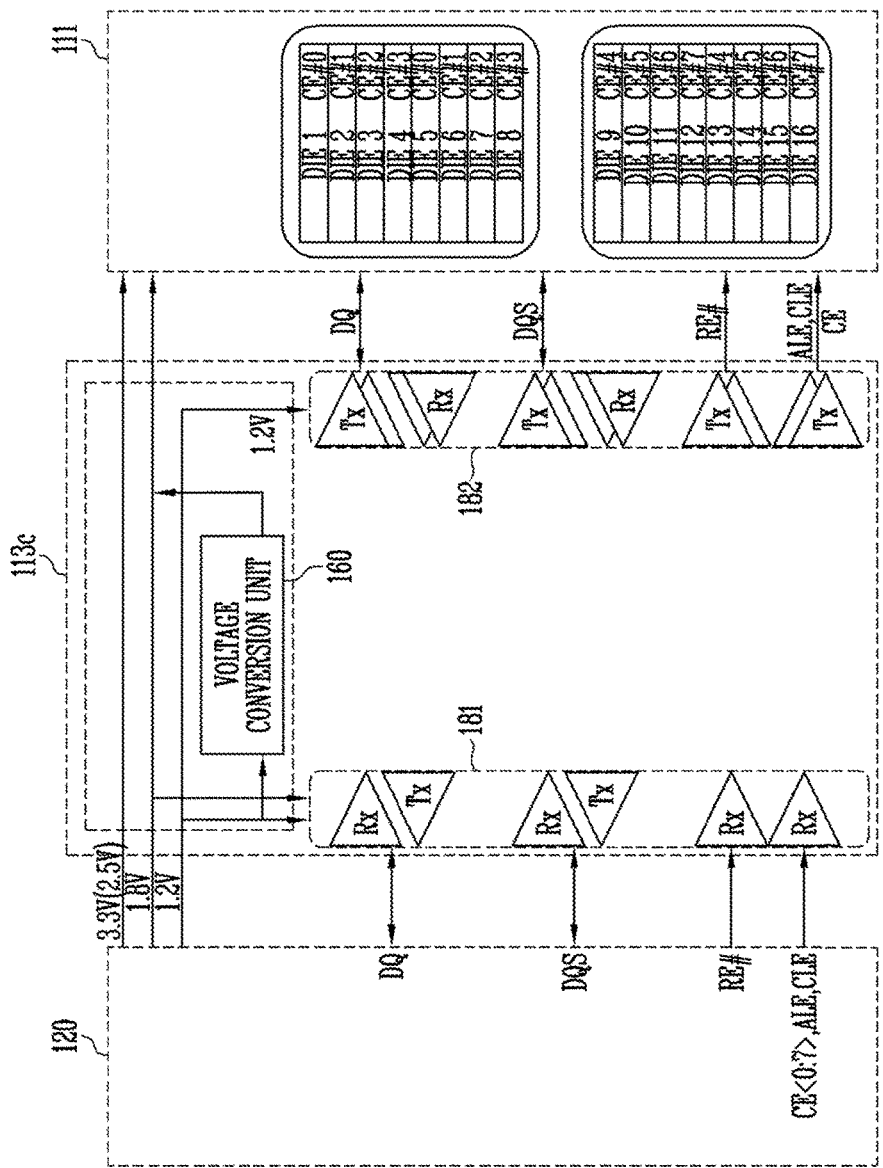
FIG. 14 is a diagram illustrating an interface chip according to an embodiment.

FIG. 14 is a diagram illustrating an interface chip 113c according to an embodiment.

Referring to FIG. 14, low and high voltages may be applied to drive the memory controller 120. According to an embodiment, the high voltage may range between 2.5V and 3.3V and the low voltage may be 1.8V. The low and high voltages used by the memory controller may also be supplied to the memory unit. For example, the memory unit may include a node VCCE through which the high voltage is input and a node VCCQ through which the low voltage is input. However, the embodiments are not limited to the voltages high or low discussed herein and can be different than those discussed.

With advancements in storage devices, the operating voltage of the memory controller 120 may gradually decrease to reduce power consumption. For example, the memory controller 120 may have a low-voltage operating voltage level of 1.2V. However, the embodiments are not limited to the operating voltage levels discussed herein and can be different than those discussed.

Therefore, data DQ, the data strobe signal DQS, the read enable signal RE#, the chip enable signal CE<0:7>, the address latch enable ALE signal and the command latch enable CLE signal which are output by the memory controller 120 may be output at a low voltage level of 1.2V. For convenience of explanation, it is assumed that as for the operating voltage of the memory unit 111, a high voltage may be 3.3V or 2.5V and a low voltage may be 1.8V. Signals having a level of 1.8V output by the memory unit 111 be greater than the low voltage of 1.2V of the memory controller 120, the memory controller 120 may recognize these signals without any difficulty. However, since signals having a level of 1.2V output by the memory controller 120 are less than the low voltage level of 1.8V of the memory unit 111, it may be difficult for the memory unit 111 to recognize these signals.

The interface chip 113c according to an embodiment described above with reference to FIG. 14 may further include a voltage conversion unit 160 for interfacing communications between the memory controller 120 and the memory unit 111 having different operating voltages. For example, the interface chip 113c may include first transmission/reception nodes 181 (i.e., Rx and Tx) communicating with the memory controller 120 and second transmission/reception nodes 182 communicating with the memory unit 111.

The voltage conversion unit 160 may increase an output of the memory controller 120 having the low voltage level of 1.2V to output a signal having a level of 1.8V or more. In other words, the voltage conversion unit 160 may regulate the voltage of 1.2V to increase to the voltage of 1.8V or more. The voltage conversion unit 160 may increase voltage levels of signals input through the first transmission/reception nodes 181 and provide the signals with the increased voltage levels to the second transmission/reception node 182. In an embodiment, for example, the voltage conversion unit may be configured to convert a driving voltage of the memory controller 120 into a driving voltage level of the memory unit 111.

The interface chip 113c according to an embodiment illustrated in FIG. 14 may be applicable to the interface chips 113a and 113b described above with FIGS. 4 and 13 and an interface chip 113d to be described below with reference to FIG. 15.

Figure 15:
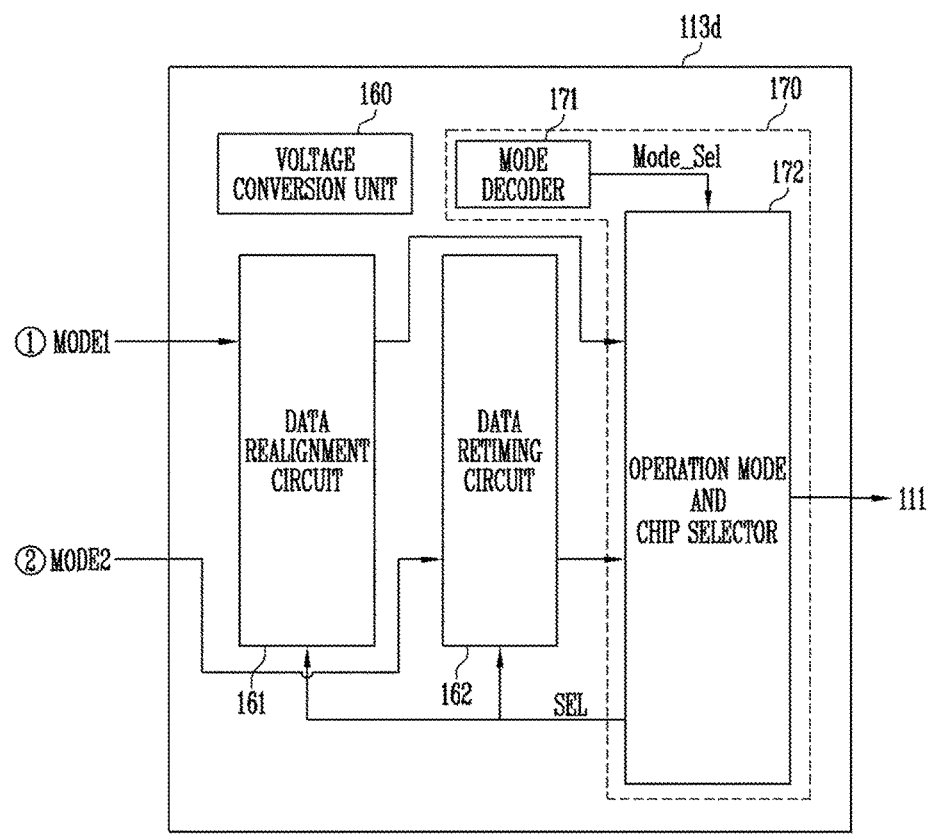
FIG. 15 is a diagram illustrating an interface chip according to an embodiment.

FIG. 15 is a diagram illustrating the interface chip 113d according to an embodiment.

Referring to FIG. 15, the interface chip 113d may include the voltage conversion unit 160, a data realignment circuit 161, a data retiming circuit 162 and a mode setting unit 170.

The data realignment circuit 161 may perform the functions of the interface chip 113a described with reference to FIG. 4. The data retiming circuit 162 may perform the functions of the interface chip 113b described with reference to FIG. 13. The voltage conversion unit 160 may perform the functions of the interface chip 113c described with FIG. 14.

The interface chip 113d illustrated in FIG. 15 may operate in a first mode or a second mode. In the first mode, the interface chip 113d may interface communications between the memory controller 120 operating at high frequency and the memory unit 111 operating at low frequency. The first mode may be an operation mode in which data being input passes through the data realignment circuit 161. In the second mode, the interface chip 113d may interface communications between the memory controller 120 operating at high frequency and the memory unit 111 operating at high frequency. The second mode may be an operation mode in which data being input passes through the data retiming circuit 162. In other words, depending on the operation mode, the interface chip 113d may operate as the interface chip 113a performing a data realigning function or the interface chip 113b performing a data retiming function.

The interface chip 113d may include the mode setting unit 170 of the interface chip 113d to set the operation mode.

The mode setting unit 170 may include a mode decoder 171 and an operation mode and chip selector 172.

The mode decoder 171 may decode a mode setting signal (not illustrated) being input to output a mode selection signal Mode_Sel. According to an embodiment, the mode setting signal (not illustrated) may be provided by the memory controller.

The mode selection signal Mode_Sel may be input to the operation mode and chip selector 172. The operation mode and chip selector 172 may generate a selection signal SEL so that the selection signal SEL may be output to the data realignment circuit 161 or the data retiming circuit 162 in response to the mode selection signal Mode_Sel. The generated selection signal SEL may be input to each of the data realignment circuit 161 and the data retiming circuit 162. Depending on the selection signal SEL, one of the data realignment circuit 161 and the data retiming circuit 162 may be activated. In other words, the selection signal SEL may be input to each of the data realignment circuit 161 and the data retiming circuit 162 and used to determine whether to activate or deactivate the corresponding circuit. In an embodiment, for example, the mode setting unit 170 may be configured for driving one of the data realignment circuit 161 and the data retiming circuit 162.

Figure 16:
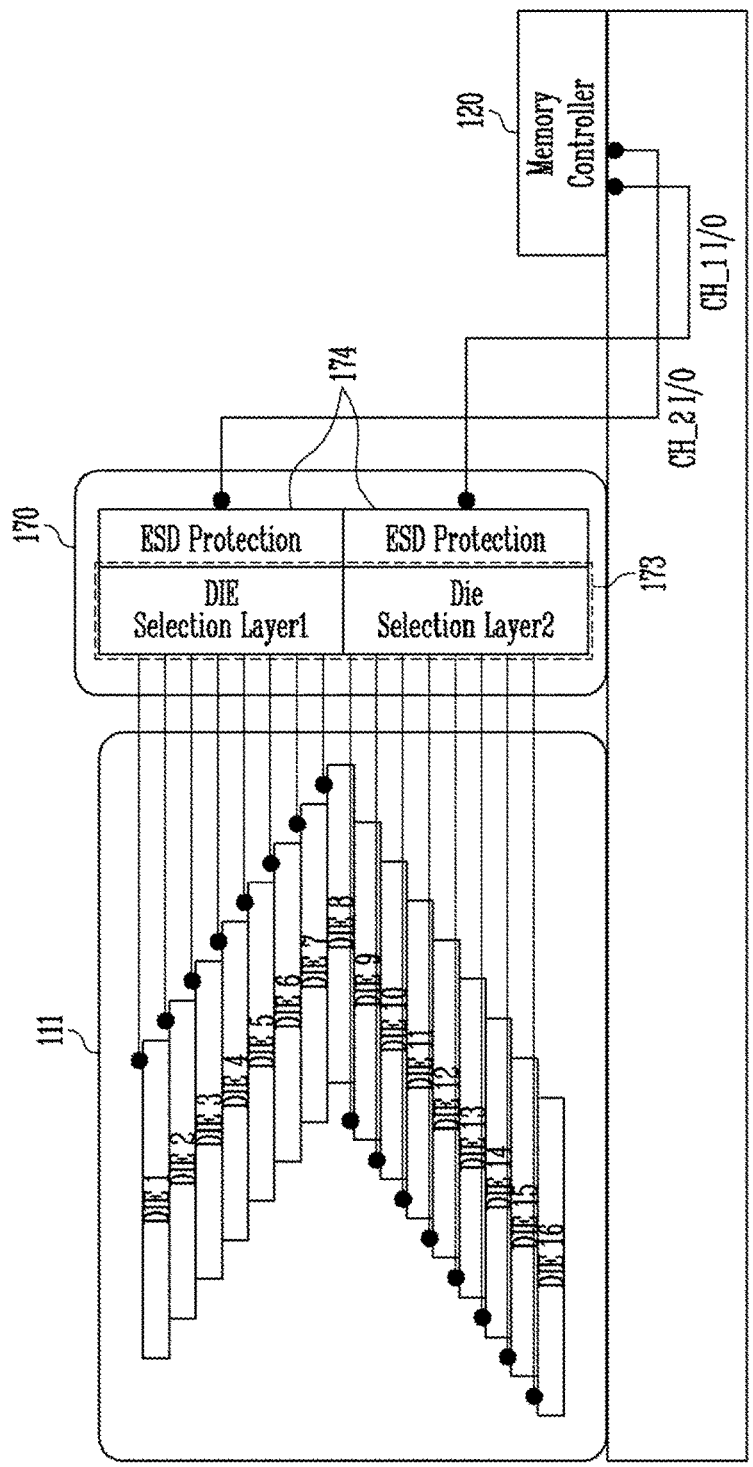
FIG. 16 is a diagram illustrating operations of a mode and chip selector illustrated in FIG. 15.

FIG. 16 is a diagram illustrating operations the operation mode and chip selector 172 illustrated in FIG. 15.

Referring to FIG. 16, the memory unit 111 may include two memory chip groups. Each of the memory chip groups may include a plurality of memory chips. A single memory chip may correspond to a single memory die. The terms "memory chip" and "die" are interchangeably used with each other.

The first memory chip group may include the first to eighth dies DIE1 to DIE8. The second memory chip group may include the ninth to sixteenth dies DIE9 to DIE16. The dies included in the first memory chip group may have a stacked structure, and the dies included in the second memory chip group may have a stacked structure. As illustrated in FIG. 16, the first memory chip group may be stacked over the second memory chip group. For example, the first die DIE1 and the sixteenth die DIE16 may be located at the top and bottom, respectively, and the second die DIE2 to fifteenth die DIE15 may be sequentially stacked therebetween. According to an embodiment, the dies may be stacked to form a stepped structure.

The dies DIE9 to DIE16 of the second memory chip group included in the lower stack may communicate with the memory controller 120 through a first channel CH_1 I/O. The dies DIE1 to DIE8 of the first memory chip group included in the upper stack may communicate with the memory controller 120 through a second channel CH_2 I/O.

When the dies are directly coupled without the mode setting unit 170, the dies DIE1 to DIE8 of the first memory chip group may be commonly coupled to the second channel CH_2 I/O, and the dies DIE9 to DIE16 of the second memory chip group may be commonly coupled to the first channel CH_1 I/O. Since unselected dies in addition to selected dies are commonly connected through the channel, resistance elements on a communication path may increase, and an operating speed and power consumption may increase.

Therefore, the operation mode and chip selector 172 included in the mode setting unit 170 may further include a die selection layer 173 and an electrostatic discharge device 174 (i.e., electrostatic protection circuit ESD). The die selection layer 173 may couple only a selected die to a channel in response to a chip enable signal CE input from the memory controller 120.

Operations of the die selection layer 173 and the electrostatic discharge device 174 will be described below with reference to FIG. 17.

Figure 17:
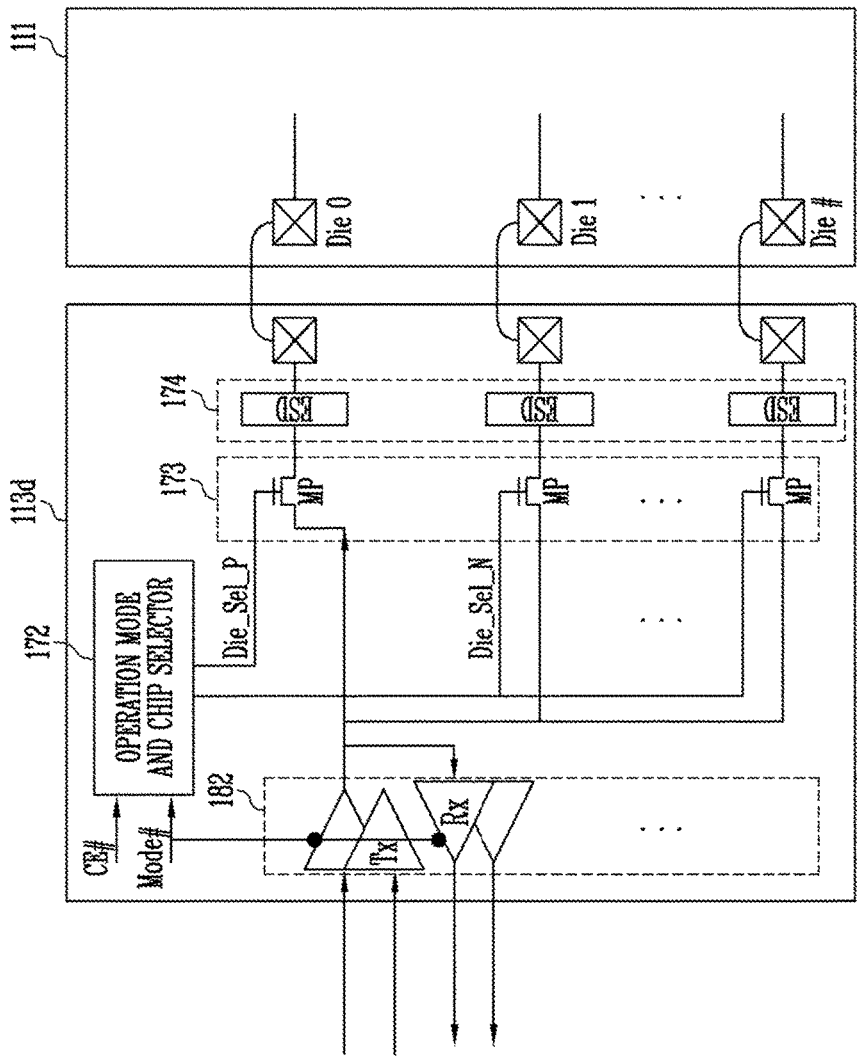
FIG. 17 is a diagram illustrating operations of a die selection layer illustrated in FIG. 16.

FIG. 17 is a diagram illustrating operations of the die selection layer 173 illustrated in FIG. 16.

Referring to FIG. 17, the interface chip 113d may include the operation mode and chip selector 172, the die selection layer 173 and the electrostatic discharge device 174.

The interface chip 113d may select the input/output node 182 to communicate with the memory unit 111 in response to a mode selection signal Mode#. In an embodiment, for example, the input/output node 182 may include transmission nodes Tx and reception nodes Rx configured to be selected by the mode selection signal Mode#.

The operation mode and chip selector 172 may receive the mode selection signal Mode# and the chip enable signal CE#. The operation mode and chip selector 172 may output a control signal to couple a selected die in response to the chip enable signal CE#.

The die selection layer 173 may include switches MP coupling the input/output node 182 for communication with the memory unit 111 to each die in response to the control signal output from the operation mode and chip selector 172. The die selection layer 173 may connect or disconnect a switch corresponding to the selected die in response to the control signal (i.e., Die_Sel_P, Die_Sel_N, etc.) of the operation mode and chip selector 172.

According to an embodiment, the interface chip 113d may include the electrostatic discharge device 174 between the die selection layer 173 and each die coupled to each other. The electrostatic discharge device 174 may include an ESD protection circuit ESD coupled to each die. In an embodiment, for example, the electrostatic discharge device 174 may provide electrostatic discharge protection between the memory controller 120 and the memory unit 111 during the data communication therebetween.

Figure 18:
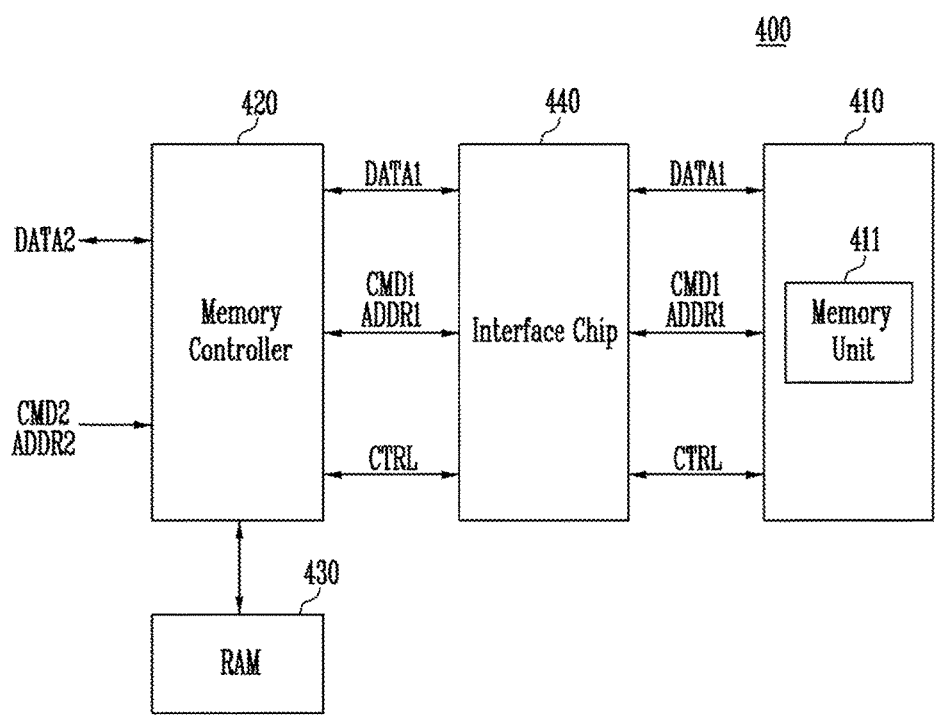
FIG. 18 is a block diagram illustrating a storage device according to an embodiment.

FIG. 18 is a block diagram illustrating a storage device 400 according to an embodiment.

Referring to FIG. 18, the storage device 400 may include a semiconductor memory device 410, a memory controller 420, a RAM 430, and an interface chip 440. In comparison with the storage device 100 described above with reference to FIG. 1, the interface chip 440 may be provided outside the semiconductor memory device 410, not inside the semiconductor memory device 410. The interface chip 440 may realign the first data DATA1 between the semiconductor memory device 410 and the memory controller 420.

The semiconductor memory device 410 may include a plurality of memory chips. The interface chip 440 may be configured to communicate with the plurality of memory chips. In an embodiment, for example, the semiconductor memory device 410 may include a memory unit 411.

Figure 19:
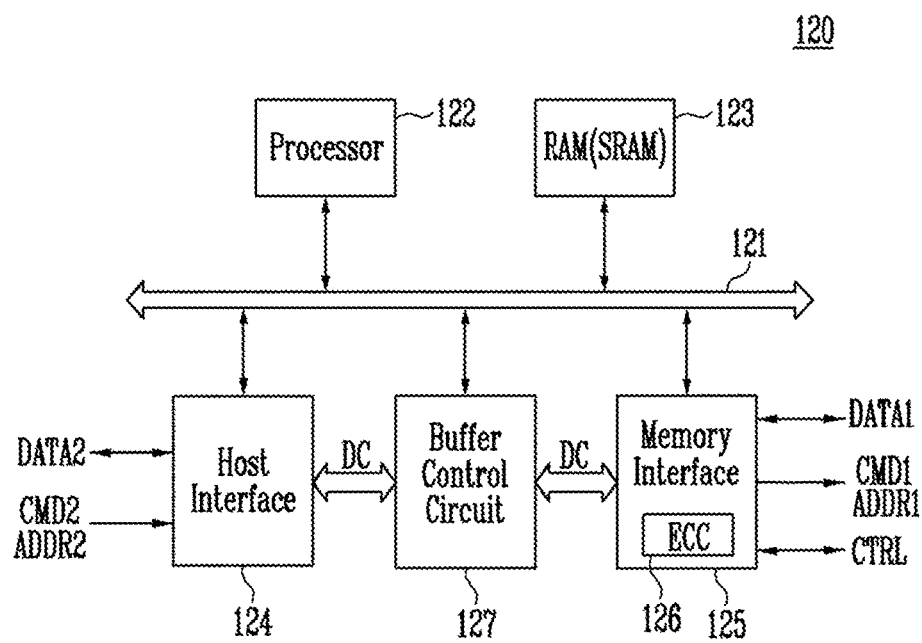
FIG. 19 is a block diagram illustrating a memory controller according to an embodiment.

FIG. 19 is a block diagram illustrating the memory controller 120 according to an embodiment.

Referring to FIGS. 1 and 18, the memory controller 120 may include a bus 121, a processor 122, an RAM(SRAM) 123, a host interface 124, a memory interface 125, and a buffer control circuit 127.

The bus 121 may be configured to provide a channel between the components of the memory controller 120. For example, the second command CMD2 and the second address ADDR2 transferred from the external host device to the memory controller 120 may be transferred to the processor 122 through the bus 121. The processor 122 may generate the first command CMD1 and the first address ADDR1 on the basis of the second command CMD2 and the second address ADDR2. The first command CMD1 and the first address ADDR1 may be transferred to the memory interface 125 through the bus 121. In other words, the bus 121 may provide a path through which a command and an address are transferred between the host interface 124, the processor 122, and the memory interface 125. In addition, the bus 121 may provide a control channel by which the processor 122 controls the host interface 124, the memory interface 125 and the buffer control circuit 127. The bus 121 may provide an access channel by which the processor 122 accesses the RAM 123.

The processor 122 may control the general operations of the memory controller 120 and perform a logical operation. The processor 122 may communicate with the external host device through the host interface 124. The processor 122 may store the second command CMD2 or the second address ADDR2 received through the host interface 124 in the RAM 123. The processor 122 may generate the first command CMD1 and the first address ADDR1 in response to the command or the address stored in the RAM(SRAM) 123 and output the first command CMD1 and the first address ADDR1 through the memory interface 125.

For example, the second address ADDR2 may be a logical address used by the host device, and the first address ADDR1 may be a physical address used by the semiconductor memory device 110. The processor 122 may load information used to convert the second address ADDR2 into the first address ADDR1 onto the RAM(SRAM) 123 and refer to the information loaded onto the RAM(SRAM) 123.

The processor 122 may control such that data received through the host interface 124 may be output through the buffer control circuit 127. The processor 122 may control so that data received through the buffer control circuit 127 may be transferred to the memory interface 125. The processor 122 may control the data received through the memory interface 125 to be controlled through the buffer control circuit 127. The processor 122 may control the data received through the buffer control circuit 127 to be output through the host interface 124 or the memory interface 125.

The RAM(SRAM) 123 may serve as an operation memory, a cache memory or a buffer memory of the processor 122. The RAM(SRAM) 123 may store codes and commands executed by the processor 122. The RAM(SRAM) 123 may store the data processed by the processor 122. The RAM(SRAM) 123 may include a static RAM (SRAM).

The host interface 124 may be configured to communicate with the external host device in response to control of the processor 122. The host interface 124 may be configured to perform communications using at least one of various communication methods, such as Universal Serial Bus (USB), Serial AT Attachment (SATA), Serial Attached SCSI (SAS), High Speed Interchip (HSIC), Small Computer System Interface (SCSI), firewire, Peripheral Component Interconnection (PCI), PCI express (PCIe), NonVolatile Memory express (NVMe), Universal Flash Storage (UFS), Secure Digital D (S), MultiMedia Card (MMC), and embedded MMC (eMMC).

The host interface 124 may transfer the second command CMD2 and the second address ADDR2 from the host device to the processor 122 through the bus 121. The host interface 124 may transfer the second data DATA2 from the host device to the buffer control circuit 127 through a data channel DC. The host interface 124 may output the second data DATA2 from the buffer control circuit 127 to the host device.

The memory interface 125 may be configured to communicate with the semiconductor memory device 110 in response to control of the processor 122. The memory interface 125 may receive the first command CMD1 and the first address ADDR1 from the processor 122 through the bus 121. The memory interface 125 may output the first command CMD1 and the first address ADDR1 to the semiconductor memory device 110. In addition, the memory interface 125 may generate the control signal CTRL on the basis of the first command CMD1 and the first address ADDR1 and output the generated control signal CTRL to the semiconductor memory device 110.

The memory interface 125 may receive the first data DATA1 through the data channel DC from the buffer control circuit 127. The memory interface 125 may output the first data DATA1 received through the data channel DC to the semiconductor memory device 110. The memory interface 125 may receive the control signal CTRL and the first data DATA1 from the semiconductor memory device 110. The memory interface 125 may transfer the first data DATA1 received from the semiconductor memory device 110 to the buffer control circuit 127 through the data channel DC.

The memory interface 125 may include an error correction block 126. The error correction block 126 may perform error correction. The error correction block 126 may generate parity for performing error correction on the basis of the first data DATA1 output from the semiconductor memory device 110 through the memory interface 125. The generated parity, along with the first data DATA1, may be written into the semiconductor memory device 110. When the first data DATA1 is received from the semiconductor memory device 110, parity associated with the first data DATA1 may also be received. The error correction block 126 may perform error correction of the first data DATA1 by using the first data DATA1, and the parity received through the memory interface 125.

The buffer control circuit 127 may be configured to control the RAM(SRAM) 123 in response to control of the processor 122. The buffer control circuit 127 may write data into the RAM(SRAM) 123 and read data from the RAM (SRAM) 123.

For example, the processor 122 may control the memory controller 120 by using codes. The processor 122 may read the codes from a nonvolatile memory (e.g., Read Only Memory) provided in the memory controller 120 and store the read codes in the RAM(SRAM) 123. In an example, the processor 122 may store the codes received through the memory interface 125 in the RAM(SRAM) 123.

For example, the memory interface 125 or the processor 122 may further perform randomization on the first data DATA1 written into the semiconductor memory device 110. Randomization may refer to an operation performed so that the first data DATA1 may be coded arbitrarily or according to predetermined rules so as to prevent a particular pattern from occurring in the first data DATA1. The memory interface 125 or the processor 122 may further perform derandomization on the first data DATA1 read from the semiconductor memory device 110.

For example, the memory interface 125 or the processor 122 may further perform encryption to increase security of the first data DATA1 written into the semiconductor memory device 110. The memory interface 125 or the processor 122 may further perform decryption on the first data DATA1 read from the semiconductor memory device 110. The encryption and decryption may be performed according to standard protocols such as Data Encryption Standard (DES) and Advanced Encryption Standard (AES).

For example, the memory controller 120 may be configured to provide an auxiliary power supply. For example, the memory controller 120 may store a power supply provided form the host device in a charging unit such as a supercap. When the power supply provided from the host device is suddenly interrupted, the memory controller 120 may use the power supply stored in the charging unit as the auxiliary power supply. The memory controller 120 may perform a backup operation with respect to an operating state of the memory controller 120 by using the auxiliary power supply, or write data, which is not written yet, into the semiconductor memory device 110. The memory controller 120 may perform a normal power-off sequence by using the auxiliary power supply.

Figure 20:
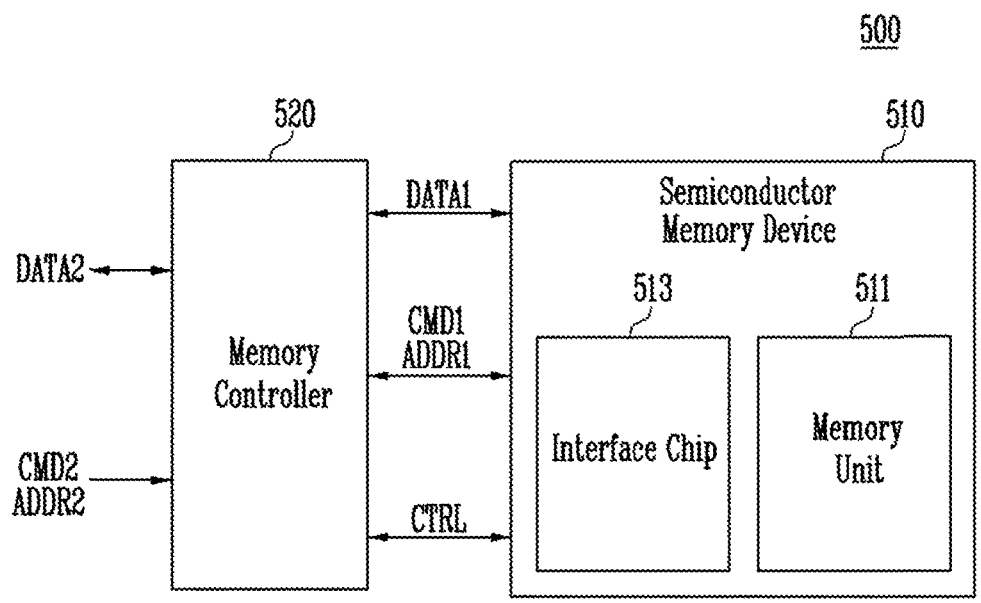
FIG. 20 is a block diagram illustrating a storage device according to an embodiment.

FIG. 20 is a block diagram illustrating a storage device 500 according to an embodiment.

Referring to FIG. 20, the storage device 500 may include a semiconductor memory device 510 and a memory controller 520. The semiconductor memory device 510 may include a memory unit 511 and an interface chip 513.

In comparison with the storage device 100 illustrated in FIG. 1, a RAM may not be provided in the storage device 500. The memory controller 520 may operate using an internal RAM instead of an external RAM.

Figure 21:
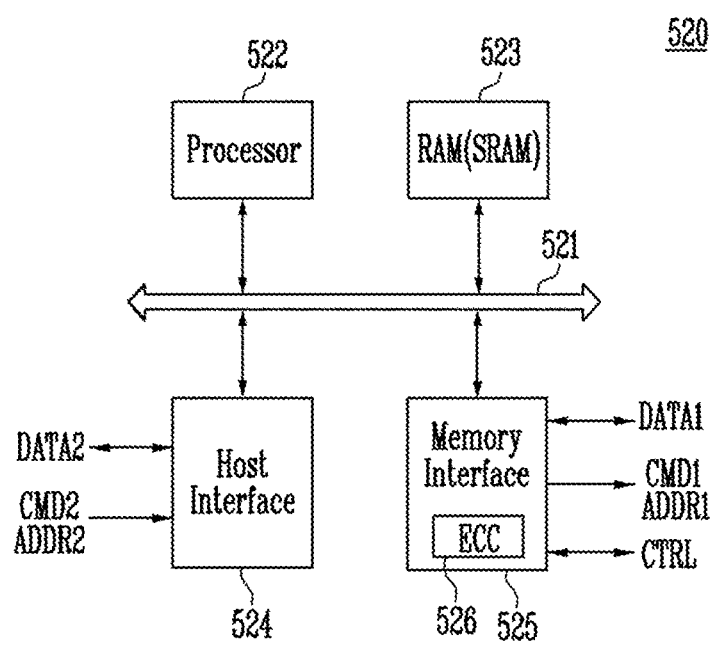
FIG. 21 is a block diagram illustrating a memory controller illustrated in FIG. 20.

FIG. 21 is a block diagram illustrating the memory controller 520 illustrated in FIG. 20.

Referring to FIG. 21, the memory controller 520 may include a bus 521, a processor 522, a RAM(SRAM) 523, a host interface 524, and a memory interface 525.

The bus 521 may be configured to provide a channel between components of the memory controller 520.

The processor 522 may control the general operations of the memory controller 520 and perform a logical operation. The processor 522 may communicate with the external host device through the host interface 525. The processor 522 may store the second command CMD2 or the second address ADDR2 received through the host interface 525 in the RAM(SRAM) 523. The processor 522 may generate the first command CMD1 and the first address ADDR1 according to a command or an address stored in the RAM 523 and output the first command CMD1 and the first address ADDR1 through the memory interface 525.

For example, the second address ADDR2 may be a logical address used by the host device and the first address ADDR1 may be a physical address used by the semiconductor memory device 510. The processor 122 may load information used when converting the second address ADDR2 into the first address ADDR1 onto the RAM(SRAM) 523, and refer to the information loaded onto the RAM(SRAM) 523.

The processor 522 may store the second data DATA2 received through the host interface 524 in the RAM(SRAM) 523. The processor 522 may transfer the data stored in the RAM(SRAM) 523 as the first data DATA1 to the memory interface 525. The processor 522 may store the first data DATA1 received through the memory interface 525 in the RAM(SRAM) 523. The processor 522 may output the data stored in the RAM 523 as the second data DATA2 to the host interface 524.

The RAM(SRAM) 523 may be used as an operation memory, a cache memory or a buffer memory of the processor 522. The RAM(SRAM) 523 may store codes and commands executed by the processor 522. The RAM (SRAM) 523 may store data processed by the processor 522. The RAM(SRAM) 523 may store the first data DATA1 written into the semiconductor memory device 510 or the first data DATA1 read from the semiconductor memory device 510. The RAM(SRAM) 523 may include a Static RAM (SRAM).

The host interface 524 may be configured to communicate with an external host device in response to control of the processor 522. The host interface 524 may be configured to perform communications using at least one of various communication methods, such as Universal Serial Bus (USB), Serial AT Attachment (SATA), Serial Attached SCSI (SAS), High Speed Interchip (HSIC), Small Computer System Interface (SCSI), firewire, Peripheral Component Interconnection (PCI), PCI express (PCIe), NonVolatile Memory express (NVMe), Universal Flash Storage (UFS), Secure Digital D (5), MultiMedia Card (MMC), and embedded MMC (eMMC).

The host interface 524 may transfer the second command CMD2 and the second address ADDR2 from the host device through the bus 521 to the processor 522. The host interface 524 may transfer the second data DATA2 received from the host device to the RAM(SRAM) 523 through the bus 521. The host interface 524 may output the second data DATA2 transferred from the RAM(SRAM) 523 through the bus 521 to the host device.

The memory interface 525 may be configured to communicate with the semiconductor memory device 510 in response to control of the processor 522. The memory interface 525 may receive the first command CMD1 and the first address ADDR1 from the processor 522 through the bus 521. The memory interface 525 may output the first command CMD1 and the first address ADDR1 to the semiconductor memory device 510. In addition, the memory interface 525 may generate the control signal CTRL on the basis of the first command CMD1 and the first address ADDR1 and output the generated control signal CTRL to the semiconductor memory device 510.

The memory interface 525 may output the first data DATA1 transferred from the RAM(SRAM) 523 through the bus 521 to the semiconductor memory device 510. The memory interface 525 may receive the control signal CTRL and the first data DATA1 from the semiconductor memory device 510. The memory interface 525 may transfer the first data DATA1 received from the semiconductor memory device 510 to the RAM(SRAM) 523 through the bus 521.

The memory interface 525 may further an error correction block 526. The error correction block 526 may perform error correction. The error correction block 526 may generate parity for performing error correction on the basis of the first data DATA1 output to the semiconductor memory device 510 through the memory interface 524. The generated parity, along with the first data DATA1, may be written into the semiconductor memory device 510. When the first data DATA1 is received from the semiconductor memory device 510, the parity associated with the first data DATA1 may also be received. The error correction block 526 may perform error correction on the first data DATA1 by using the first data DATA1, the first data DATA1 and the parity received through the memory interface 525.

For example, the processor 522 may control the memory controller 520 by using codes. The processor 522 may read the codes from a nonvolatile memory (e.g., Read Only Memory) provided in the memory controller 520 and store the read codes in the RAM 523. In an example, the processor 522 may store the codes received from the memory interface 525 in the RAM(SRAM) 523.

According to an embodiment, the memory interface 525 or the processor 522 may further perform randomization on the first data DATA1 written into the semiconductor memory device 510. Randomization may refer to an operation in which the first data DATA1 may be coded arbitrarily or according to predetermined rules so as to prevent a particular pattern from occurring in the first data DATA1. The memory interface 525 or the processor 522 may further perform derandomization on the first data DATA1 read from the semiconductor memory device 510.

For example, the memory interface 525 or the processor 522 may further perform encryption to increase security of the first data DATA1 written into the semiconductor memory device 510. The memory interface 525 or the processor 522 may further perform decryption on the first data DATA1 read from the semiconductor memory device 510. The encryption and decryption may be performed according to standard protocols such as Data Encryption Standard (DES) and Advanced Encryption Standard (AES).

According to an embodiment, the memory controller 520 may be configured to provide an auxiliary power supply. For example, the memory controller 520 may store a power supply provided from the host device in a charge unit such as a supercap. When the power supply provided from the host device is suddenly interrupted, the memory controller 520 may use the power supply stored in the charge unit as the auxiliary power supply. The memory controller 520 may perform a backup operation with respect to an operating state of the memory controller 520, or write data, which is not yet written, into the semiconductor memory device 510 by using the auxiliary power supply. The memory controller 520 may perform a normal power-off sequence by using the auxiliary power supply.

Figure 22:
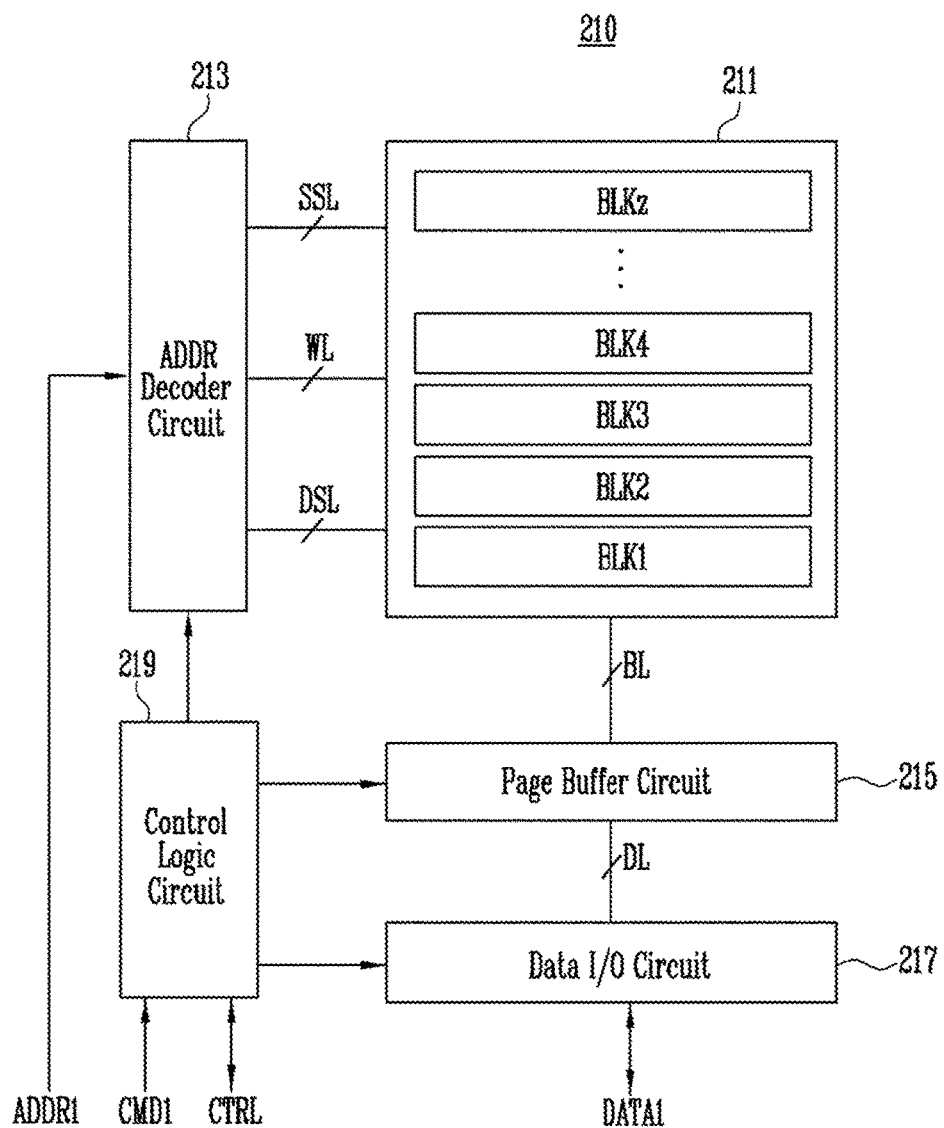
FIG. 22 is a block diagram illustrating a semiconductor memory device according to an embodiment.

FIG. 22 is a block diagram illustrating a semiconductor memory device 210 according to an embodiment.

Referring to FIGS. 1 and 22, the semiconductor memory device 210 may include a memory cell array 211, an address decoder circuit 213, a page buffer circuit 215, a data input/output (I/O) circuit 217, and a control logic circuit 219.

The memory cell array 211 may include a plurality of memory blocks BLK1 to BLKz each of which includes a plurality of memory cells. Each memory block may be coupled to the address decoder circuit 213 through at least one source selection line SSL, a plurality of word lines WL, and at least one drain selection line DSL. Each memory block may be coupled to the page buffer circuit 215 through a plurality of bit lines BL. The plurality of memory blocks BLK1 to BLKz may be commonly coupled to the plurality of bit lines BL. The memory cells of each of the memory blocks BLK1 to BLKz may have the same structure. According to an embodiment, each of the plurality of memory blocks BLK1 to BLKz may be a unit for an erase operation. In other words, the memory cells of the memory cell array 211 may be erased in unit of a single memory block. Memory cells in a single memory block may be erased at the same time.

The address decoder circuit 213 may be coupled to the memory cell array 211 through a plurality of source selection lines SSL, a plurality of word lines WL, and a plurality of drain selection lines DSL. The address decoder circuit 213 may operate in response to control of the control logic circuit 219. The address decoder circuit 213 may receive the first address ADDR1 from the memory controller 120. The address decoder circuit 213 may decode the received first address ADDR1 and control voltages applied to the word lines WL according to the decoded address.

For example, during a write operation, the address decoder circuit 213 may apply a program voltage VGPM to a selected word line of the selected memory block indicated by the first address ADDR1 and a pass voltage VPASS to unselected word lines of the selected memory block. In a read, the address decoder circuit 213 may apply a selected read voltage VRD to a selected word line of the selected memory block indicated by the first address ADDR1 and an unselected read voltage VREAD to unselected word lines of the selected memory block. In an erase, the address decoder circuit 213 may apply an erase voltage (e.g., a ground voltage) to word lines of the selected memory block indicated by the first address ADDR1.

The page buffer circuit 215 may be coupled to the memory cell array 211 through the plurality of bit lines BL. The page buffer circuit 215 may be coupled to the data input/output circuit 217 through a plurality of data lines DL. The page buffer circuit 215 may operate in response to the control logic circuit 219.

The page buffer circuit 215 may store data to be written into the memory cells of the memory cell array 211, or data from the memory cells. During a write operation, the page buffer circuit 215 may store the data to be written into the memory cells. On the basis of the stored data, the page buffer circuit 215 may bias the plurality of bit lines BL. During the write operation, the page buffer circuit 215 may function as a write driver. During a read, the page buffer circuit 215 may sense voltages in the bit lines BL and store a sensing result. During the read, the page buffer circuit 215 may function as a sense amplifier.

The data input/output circuit 217 may be coupled to the page buffer circuit 215 through the plurality of data lines DL. The data input/output circuit 217 may exchange the first data DATA1 with the memory controller 120.

The data input/output circuit 217 may temporarily store the first data DATA1 received from the memory controller 220. The data input/output circuit 217 may transfer the stored data to the page buffer circuit 215. The data input/output circuit 217 may temporarily store the data DATA transferred from the page buffer circuit 215. The data input/output circuit 217 may transfer the stored data DATA to the memory controller 220. The data input/output circuit 217 may function as a buffer memory.

The control logic circuit 219 may receive the first command CMD1 and the control signal CTRL from the memory controller 220. The control logic circuit 219 may decode the received first command CMD1 and control the general operations of the semiconductor memory device 210 according to the decoded command.

Figure 23:
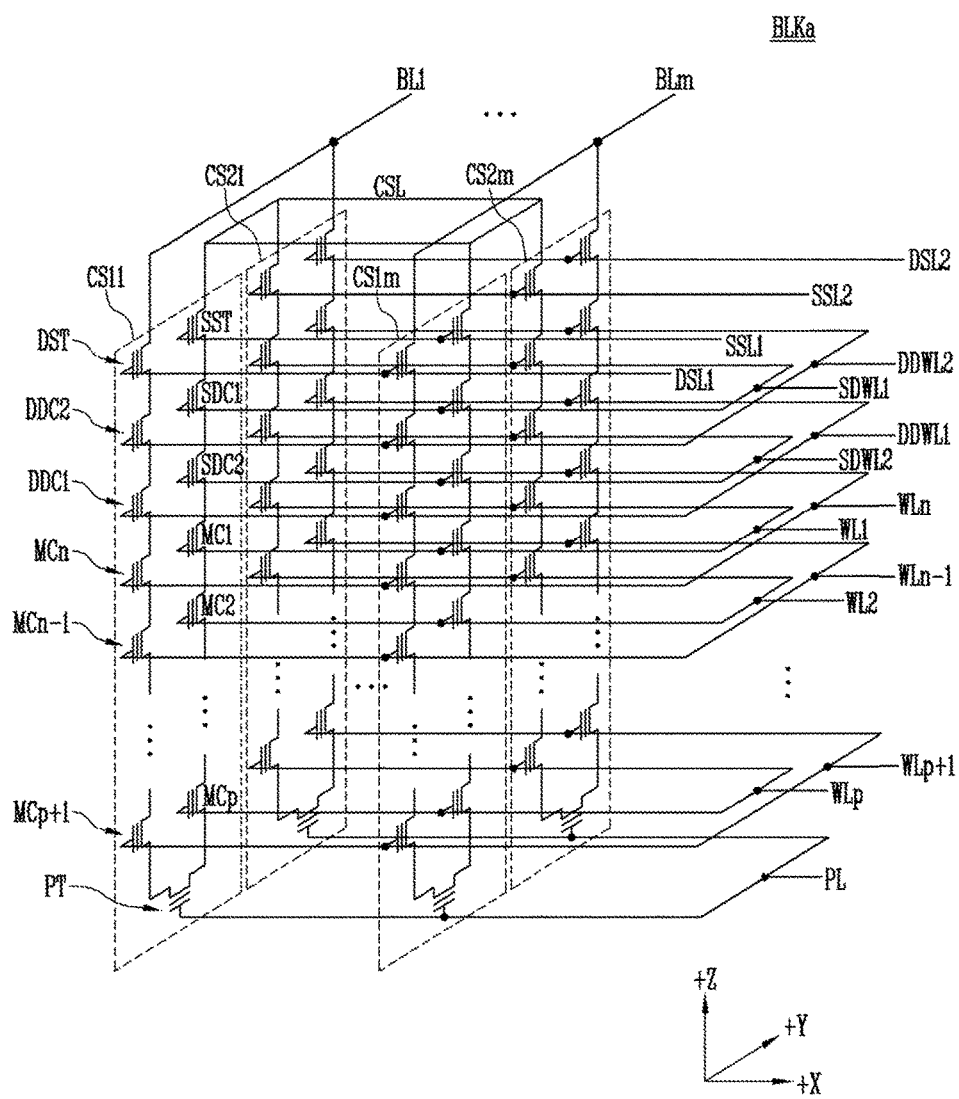
FIG. 23 is a circuit diagram illustrating one (BLKa) of memory blocks BLK1 to BLKz illustrated in FIG. 22.

FIG. 23 is a circuit diagram illustrating one (BLKa) of the memory blocks BLK1 to BLKz illustrated in FIG. 22.

Referring to FIG. 23, the memory block BLKa may include a plurality of cell strings CS11 to CS1m and CS21 to CS2m. According to an embodiment, each of the cell strings CS11 to CS1m and CS21 to CS2m may have a 'U' shape. In the memory block BLKa, 'm' cell strings may be arranged in a row direction (i.e., +X direction). As illustrated in FIG. 23, for convenience of explanation, two cell strings may be arranged in a column direction (i.e., +Y direction). However, three or more cell strings may also be arranged in the column direction.

Each of the plurality of cell strings CS11 to CS1m and CS21 to CS2m may include at least one source selection transistor SST, one or more source side dummy memory cells SDC1 and SDC2, first to nth normal memory cells MC1 to MCn, a pipe transistor PT, one or more drain side dummy memory cells DDC1 and DDC2, and at least one drain selection transistor DST.

The selection transistors SST and DST, the dummy memory cells SDC1, SDC2, DDC1, and DDC2 and the first to nth normal memory cells MC1 to MCn may have similar structures to each other. According to an embodiment, each of the selection transistors SST and DST, the dummy memory cells SDC1, SDC2, DDC1, and DDC2 and the normal memory cells MC1 to MCn may include a channel layer, a tunneling insulating layer, a charge storage layer and a blocking insulating layer.

The source selection transistor SST of each cell string may be coupled between the common source line CSL and the source side dummy memory cells SDC1 and SDC2.

According to an embodiment, source selection transistors of cell strings arranged in the same row may be coupled to a source selection line extending in the row direction. Source selection transistors of cell strings arranged in different rows may be coupled to different source selection lines. As shown in FIG. 23, source selection transistors of the cell strings CS11 to CS1m in the first row may be coupled to the first source selection line SSL1, and source selection transistors of cell strings CS21 to CS2m in the second row may be coupled to the second source selection line SSL2.

For example, the two source side dummy memory cells SDC1 and SDC2 may be provided to each cell string. However, three or more source side dummy memory cells may also be provided in each cell string. The source side dummy memory cells SDC1 and SDC2 in each cell string may be coupled in series between the source selection transistor SST and normal memory cells MC1 to MCp. A gate of the first source side dummy memory cell SDC1 of each cell string may be coupled to the first source side dummy word line SDWL1. A gate of the second source side dummy memory cell SDC2 may be coupled to the second source side dummy word line SDWL2.

The first to nth normal memory cells MC1 to MCn of each cell string may be coupled between the source side dummy memory cells SDC1 and SDC2 and the drain side dummy memory cells DDC1 and DDC2.

The first to nth normal memory cells MC1 to MCn may be divided into the first to pth normal memory cells MC1 to MCp and (p+1)th to nth normal memory cells MCp+1 to MCn. The first to pth normal memory cells MC1 to MCp may be sequentially arranged in a reverse direction to the +Z direction and be coupled in series between the source side dummy memory cells SDC1 and SDC2 and the pipe transistor PT. The (p+1)th to nth normal memory cells MCp+1 to MCn may be sequentially arranged in the +Z direction and be coupled in series between the pipe transistor PT and the drain side dummy memory cells DDC1 and DDC2. The first to pth normal memory cells MC1 to MCp and the (p+1)th to nth normal memory cells MCp+1 to MCn may be coupled to each other through the pipe transistor PT. Gates of the first to nth normal memory cells MC1 to MCn of each cell string may be coupled to the first to nth normal word lines WL1 to WLn, respectively.

Data may be stored in the first to nth normal memory cells MC1 to MCn through first to mth bit lines BL1 to BLm. The data stored in the first to nth normal memory cells MC1 to MCn may be read through the first to mth bit lines BL1 to BLm.

A gate of the pipe transistor PT of each cell string may be coupled to a pipe line PL.

For illustrative purposes, the two drain side dummy memory cells DDC1 and DDC2 may be provided in each cell string. However, three or more drain side dummy memory cells may also be provided in each cell string. The drain side dummy memory cells DDC1 and DDC2 of each cell string may be coupled in series between the drain selection transistor DST and the normal memory cells MCp+1 to MCn. The gate of the first drain side dummy memory cell DDC1 of each cell string may be coupled to a first drain side dummy word line DDWL1. The gate of the second drain side dummy memory cell DDC2 of each cell string may be coupled to a second drain side dummy word line DDWL2.

The drain selection transistor DST of each cell string may be coupled between the corresponding bit line and the drain side dummy memory cells DDC1 and DDC2. Cell strings arranged in a row direction may be coupled to a drain selection line extending in the row direction. Drain selection transistors of the cell strings CS11 to CS1m in the first row may be coupled to the first drain selection line DSL1. Drain selection transistors of the cell strings CS21 to CS2m in the second row may be coupled to the second drain selection line DSL2.

Cell strings arranged in a column direction may be coupled to a bit line extending in the column direction. As illustrated in FIG. 4, the cell strings CS11 and CS21 in the first column may be coupled to the first bit line BL1. The cell strings CS1m and CS2m in an mth column may be coupled to an mth bit line BLm.

According to an embodiment, even bit lines and odd bit lines may replace the first to mth bit lines BL1 to BLm. In addition, even cell strings of the cell strings CS11 to CS1m or CS21 to CS2m arranged in the row direction may be coupled to even bit lines, respectively, and odd cell strings of the cell strings CS11 to CS1m or CS21 to CS2m arranged in the row direction may be coupled to odd bit lines, respectively.

According to an embodiment, the dummy memory cells SDC1, SDC2, DDC1, and DDC2 may be provided to stably control a voltage or current of the corresponding cell string. For example, the source side dummy memory cells SDC1 and SDC2 may be provided to reduce an electric field between the source selection transistor SST and the normal memory cells MC1 to MCp. For example, the drain side dummy memory cells DDC1 and DDC2 may be provided to reduce an electric field between the drain selection transistor DST and the normal memory cells MCp+1 to MCn. When more dummy memory cells are provided, the operational reliability of the memory block BLKa may increase, whereas the size of the memory block BLKa may increase. On the other hand, when fewer memory cells are provided, the size of the memory block BLKa may decrease, whereas the operational reliability of the memory block BLKa may decrease.

In order to efficiently control the dummy memory cells SDC1, SDC2, DDC1, and DDC2, the dummy memory cells SDC1, SDC2, DDC1, and DDC2 may be required to have desired threshold voltages. Prior to performing an erase operation on the memory block BLKa, pre-program operations may be performed on part or entirety of the dummy memory cells SDC1, SDC2, DDC1, and DDC2. The dummy memory cells SDC1, SDC2, DDC1, and DDC2 may have desired threshold voltages by controlling voltages applied to the dummy word lines SDWL1, SDWL2, DDWL1, and DDWL2 coupled to the dummy memory cells SDC1, SDC2, DDC1, and DDC2 when performing an erase operation after the pre-program operations.

Figure 24:
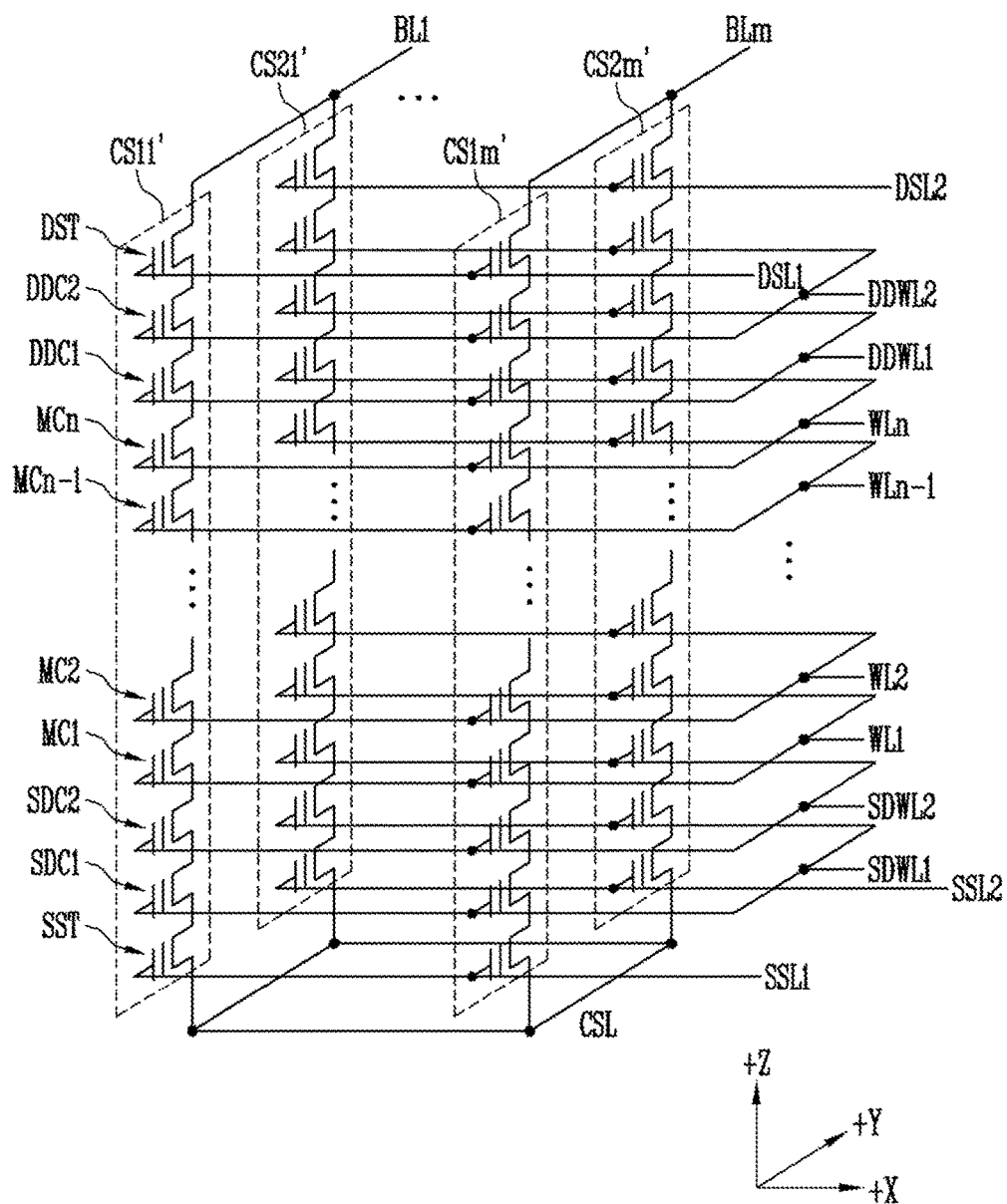
FIG. 24 is a circuit diagram illustrating an embodiment (BLKb) of the memory blocks BLK1 to BLKz illustrated in FIG. 22.

FIG. 24 is a circuit diagram illustrating an embodiment (BLKb) of the memory blocks BLK1 to BLKz illustrated in FIG. 22.

Referring to FIG. 24, the first memory block BLKb may include a plurality of cell strings CS11' to CS1m' and CS21' to CS2m'. Each of the cell strings CS11' to CS1m' and CS21' to CS2m' may extend in the +Z direction. Each of the cell strings CS11' to CS1m' and CS21' to CS2m' may include at least one source selection transistor SST, one or more source side dummy memory cells SDC1 and SDC2, first to nth normal memory cells MC1 to MCn, one or more drain side dummy memory cell DDC1 and DDC2, and at least one drain selection transistor DST stacked over a substrate (not illustrated) under the first memory block BLKb.

The source selection transistor SST of each cell string may be coupled between the common source line CSL and the source side dummy memory cells SDC1 and SDC2. Source selection transistors of cell strings (e.g., CS11' to CS1m') arranged in the same row may be coupled to the same source selection line (e.g., SSL1). Source selection transistors of the cell strings CS11' to CS1m' arranged in the first row may be coupled to the first source selection line SSL1. Source selection transistors of the cell strings CS21' to CS2m' arranged in the second row may be coupled to the second source selection line SSL2.

The source side dummy memory cells SDC1 and SDC2 of each cell string may be coupled in series between the source selection transistor SST and normal memory cells MC1 to MCn. Source side dummy memory cells located in the same height may be coupled to the same source side dummy word line. Gates of the first and second source side dummy memory cells SDC1 and SDC2 may be coupled to the first and second source side dummy word lines SDWL1 and SDWL2, respectively.

The first to nth normal memory cells MC1 to MCn of each cell string may be coupled in series between the source side dummy memory cells SDC1 and SDC2 and the drain side dummy memory cells DDC1 and DDC2. Gates of the first to nth normal memory cells MC1 to MCn may be coupled to the first to nth normal word lines WL1 to WLn, respectively.

The drain side dummy memory cells DDC1 and DDC2 of each cell string may be coupled in series between the drain selection transistor DST and the normal memory cells MC1 to MCn. Drain side dummy memory cells located at the same height may be coupled to the same source side dummy word line. The first and second drain side dummy memory cells DDC1 and DDC2 may be coupled to the first and second drain side dummy word lines DDWL1 and DDWL2, respectively.

The drain selection transistor DST in each cell string may be coupled between the corresponding bit line and the drain side dummy memory cells DDC1 and DDC2. Drain selection transistors of cell strings arranged in a row direction may be coupled to a drain selection line extending in the row direction. Drain selection transistors of the cell strings CS11' to CS1m' in the first row may be coupled to the first drain selection line DSL1. Drain selection transistors of the cell strings CS21' to CS2m' in the second row may be coupled to the second drain selection line DSL2.

As a result, the memory block BLKb illustrated in FIG. 24 may have a similar equivalent circuit with the memory block BLKa illustrated in FIG. 23 except that the pipe transistor PT is removed from each cell string.

The memory blocks BLKa and BLKb illustrated in FIGS. 23 and 24, respectively, are illustrated as examples. The technical spirit is not limited thereto. For example, the number of rows of cell strings may increase or decrease. The increase or decrease in number of rows of the cell strings may cause a change in number of drain selection lines or source selection lines coupled to the rows of the cell strings and a change in number of cell strings coupled to a single bit line.

The number of columns of the cell strings may increase or decrease. The increase or decrease in number of columns of the cell strings may cause a change in number of bit lines coupled to columns of the cell strings and a change in number of cell strings coupled to a single string selection line.

The height of each cell string may increase or decrease. For example, the number of drain selection transistors, memory cells or source selection transistors stacked in each cell string may increase or decrease.

Figure 25:
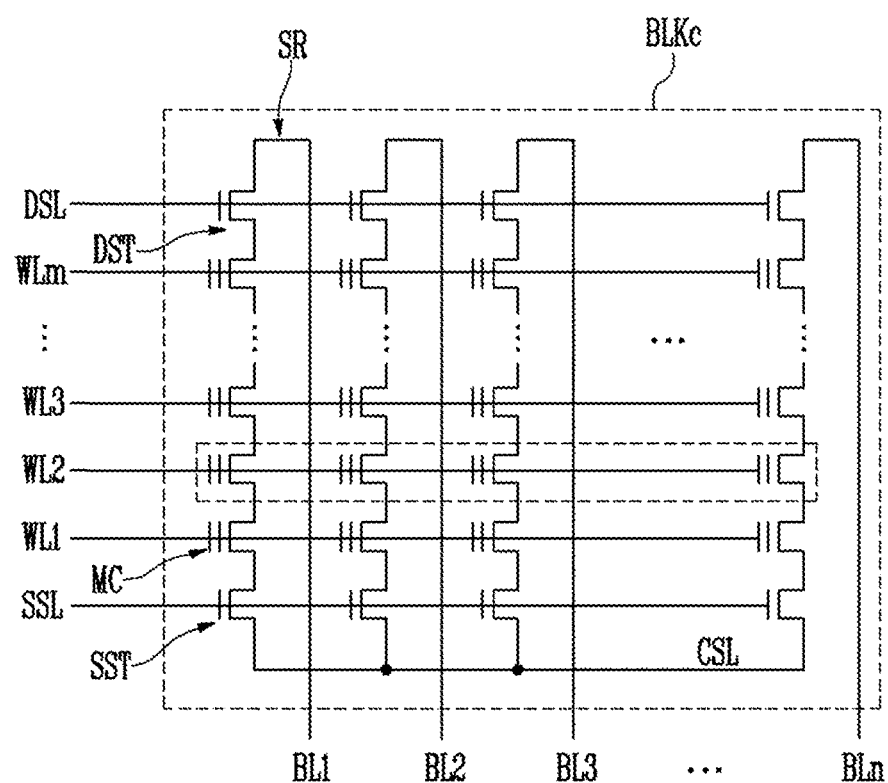
FIG. 25 is a circuit diagram illustrating an embodiment (BLKc) of the memory blocks BLK1 to BLKz illustrated in FIG. 22.

FIG. 25 is a circuit diagram illustrating an embodiment (BLKc) of the memory blocks BLK1 to BLKz illustrated in FIG. 22.

Referring to FIG. 25, the memory block BLKc may include a plurality of strings SR. The plurality of strings SR may be coupled to the plurality of bit lines BL1 to BLn, respectively. Each string SR may include the source selection transistor SST, the memory cells MC, and the drain selection transistor DST.

The source selection transistor SST of each string SR may be coupled between the memory cells MC and the common source line CSL. The source selection transistors SST of the plurality of strings SR may be commonly coupled to the common source line CSL.

The drain selection transistor DST of each string SR may be coupled between the memory cells MC and the bit line BL. The drain selection transistors DST of the plurality of strings SR may be coupled to the plurality of bit lines BL1 to BLn, respectively.

In each string SR, the plurality of memory cells MC may be provided between the source selection transistor SST and the drain selection transistor DST. In each string SR, the plurality of memory cells MC may be coupled in series.

In the plurality of strings SR, the memory cells MC located in the same order from the common source line CSL may be commonly coupled to a single word line. The memory cells MC of the plurality of strings SR may be coupled to the plurality of word lines WL1 to WLm.

In the memory block BLKc, an erase may be performed in unit of a memory block. When erase is performed in unit of a memory block, all memory cells MC of the memory block BLKc may be erased at the same time in response to a single erase request.

Figure 26:
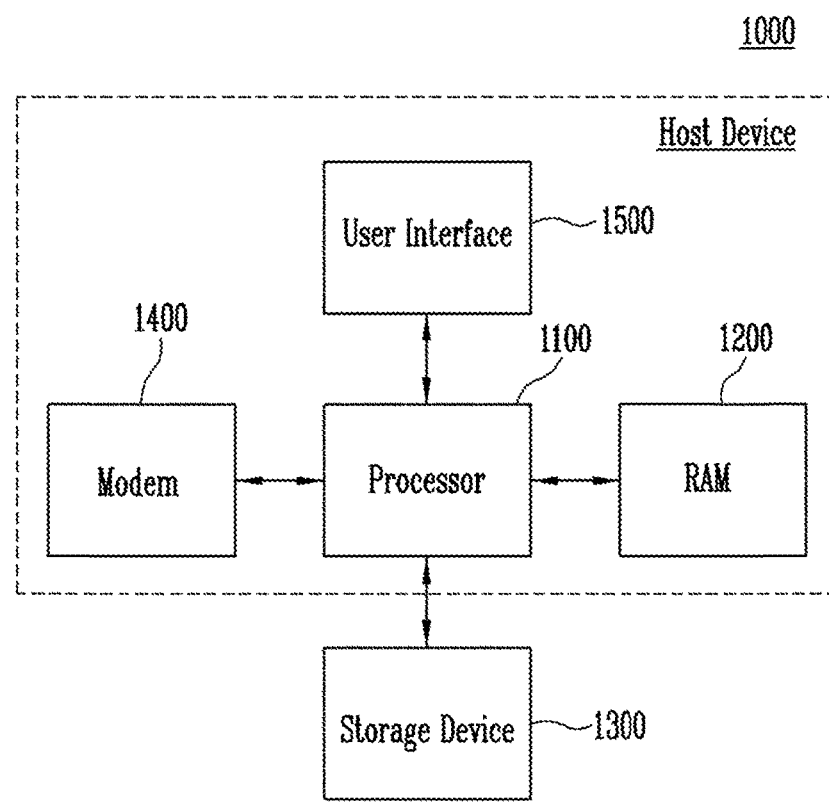
FIG. 26 is a block diagram illustrating a computing device according to an embodiment.

FIG. 26 is a block diagram illustrating a computing device 1000 according to an embodiment.

Referring to FIG. 26, the computing device 1000 may include a processor 1100, a RAM 1200, a storage device 1300, a modem 1400, and a user interface 1500.

The processor 1100 may control the general operations of the computing device 1000 and perform a logical operation. For example, the processor 1100 may include a System-on-Chip (SoC). The processor 1100 may be a general purpose processor, a specific purpose processor, or an application processor.

The RAM 1200 may communicate with the processor 1100. The RAM 1200 may be the processor 1100 or a main memory of the computing device 1000. The processor 1100 may temporarily store codes or data in the RAM 1200. The processor 1100 may execute the codes and process the data by using the RAM 1200. The processor 1100 may execute various types of software such as an operating system and an application by using the RAM 1200. The processor 1100 may control the general operation of the computing device 1000 by using the RAM 1200. The RAM 1200 may include a volatile memory such as Static RAM (SRAM), Dynamic RAM (DRAM), and Synchronous DRAM (SDRAM), or a nonvolatile memory such as Phase-change RAM (PRAM), Magnetic RAM (MRAM), Resistive RAM (RRAM), and Ferroelectric RAM (FeRAM).

The storage device 1300 may communicate with the processor 1100. The storage device 1300 may store data which requires long-term storage. In other words, the processor 1100 may store the data requiring long-term storage in the storage device 1300. The storage device 1300 may store a boot image for driving the computing device 1000. The storage device 1300 may store source codes of various types of software such as an operating system and an application. The storage device 1300 may store data processed by the software such as the operating system and the application.

According to an embodiment, the processor 1100 may load the source codes stored in the storage device 1300 onto the RAM 1200 and execute the codes loaded onto the RAM 1200 to drive various types of software such as an operating system and an application. The processor 1100 may load the data stored in the storage device 1300 onto the RAM 1200 and process the data loaded on the RAM 1200. The processor 1100 may store data requiring long-time storage, among the data stored in the RAM 1200, in the storage device 1300.

The storage device 1300 may include a nonvolatile memory such as a flash memory, Phase-change RAM (PRAM), Magnetic RAM (MRAM), Resistive RAM (RRAM), and Ferroelectric RAM (FRAM).

The modem 1400 may perform communication with an external device in response to control of the processor 1100. For example, the modem 1400 may perform wired or wireless communication with the external device. The modem 1400 may perform communications based on at least one of various wireless communications methods such as Long Term Evolution (LTE), WiMax, Global System for Mobile communication (GSM), Code Division Multiple Access (CDMA), Bluetooth, Near Field Communication (NFC), WiFi, Radio Frequency IDentification (RFID), or various wired communication methods such as Universal Serial Bus (USB), Serial AT Attachment (SATA), High Speed Interchip (HSIC), Small Computer System Interface (SCSI), Firewire, Peripheral Component Interconnection (PCI), PCIe (PCI express), NVMe (NonVolatile Memory express), UFS (Universal Flash Storage), SD (Secure Digital), SDIO, UART (Universal Asynchronous Receiver Transmitter), SPI (Serial Peripheral Interface), HS-SPI (High Speed SPI), RS232, I2C (Inter-integrated Circuit), HS-I2C, I2S, (Integrated-interchip Sound), S/PDIF (Sony/Philips Digital Interface), MMC (MultiMedia Card), and embedded MMC (eMMC).

The user interface 1500 may communicate with a user in response to control of the processor 1100. For example, the user interface 1500 may include user input interfaces such as a keyboard, a key pad, a button, a touch panel, a touch screen, a touch pad, a touch ball, a camera, a microphone, a gyroscope sensor, and a vibration sensor. The user interface 1500 may include user output interfaces such as a Liquid Crystal Display (LCD), an Organic Light Emitting Diode (OLED) display device, an Active Matrix OLED (AMOLED) display device, an LED, a speaker, and a motor.

The storage device 1300 may include at least one of the storage devices 100, 200, 300, 400, and 500 according to the various embodiments. The processor 1100, the RAM 1200, the modem 1400, and the user interface 1500 may constitute a host device communicating with the storage device 1300.

According to the present technique, a storage device having improved reliability and an operating method thereof may be provided.

While various examples of embodiments have been particularly illustrated and described with reference to examples thereof, it will be understood by those of ordinary skill in the art that various changes in form and details may be made therein without departing from the spirit and scope of the present disclosure as defined by the following claims.

It will be understood by those skilled in the art that various changes in form and details may be made therein without departing from the spirit and scope of the disclosure as defined by the appended claims.

The preferred embodiments should be considered in descriptive sense only and not for purposes of limitation. Therefore, the scope of the invention is defined not by the detailed description but by the appended claims, and all differences within the scope will be construed as being included.

In the above-described embodiments, all steps may be selectively performed, or skipped. In addition, in each embodiment, steps may not necessarily be performed in order, and may be switched. Thus, it is understood, that while the forms herein illustrated and described include the best mode contemplated, they are not intended to illustrate all possible forms thereof. It will also be understood that the words used are descriptive rather than limiting, and that various changes may be made without departing from the spirit and scope of the disclosure.

In addition, it should be further appreciated that any specific terms or applications used herein are only for the convenience of description, and thus the present disclosure should not be limited to only use in any specific terms or applications represented and/or implied by such terms.

What is claimed is:

1. A storage device, comprising:
 a semiconductor memory device; and
 a memory controller configured for controlling the semiconductor memory device, wherein the semiconductor memory device comprises:
a memory unit including a plurality of memory chips; and
an interface chip realigning serial data received from the memory controller into parallel data and transferring the parallel data to each of the plurality of memory chips.

2. The storage device of claim 1, wherein the interface chip comprises a data realignment circuit transferring write data received from the memory controller to a first memory and a second memory, among the plurality of memory chips, wherein even data and odd data are sequentially repeated in the write data.

3. The storage device of claim 2, wherein the data realignment circuit comprises:
a data serializer and deserializer (serializer/deserializer) receiving the write data from the memory controller in response to a first timing signal; and
a timing signal processor generating a second timing signal to separate the even data from the odd data.

4. The storage device of claim 3, wherein the data serializer/deserializer stores the even data in a first latch at a falling edge of a signal delayed by a predetermined time or cycle from the first timing signal and the odd data in a second latch at a rising edge thereof.

5. The storage device of claim 4, wherein the second timing signal has a cycle of a half of a cycle of the first timing signal, and
the data realignment circuit transfers the even data and the odd data stored in the first latch and the second latch to the first memory and the second memory, respectively, in synchronization with the second timing signal based on chip enable signals.

6. The storage device of claim 2, wherein the data realignment circuit generates read data from the even data and the odd data received from the first memory and the second memory, respectively, among the plurality of memory chips, and transfers the read data to the memory controller, wherein the even data and the odd data are sequentially repeated in the read data.

7. The storage device of claim 6, wherein the data realignment circuit comprises:
a data serializer/deserializer receiving the even data and the odd data from the first memory and the second memory in synchronization with a third timing signal and in response to read enable signals; and
a timing signal processor generating a timing signal to generate the read data from the even data and the odd data.

8. The storage device of claim 7, wherein the timing signal processor transfers a fifth timing signal obtained by inverting a fourth timing signal received from the memory controller to the data serializer/deserializer, and
the data serializer/deserializer inputs the even data to a register at a rising edge of the fifth timing signal and stores the odd data in the register at a falling edge thereof.

9. The storage device of claim 8, wherein the timing signal processor generates a sixth timing signal having a frequency two times greater than a frequency of the third timing signal.

10. The storage device of claim 9, wherein the data realignment circuit transfers data stored in the register to the memory controller according to the sixth timing signal.

11. The storage device of claim 2, wherein the memory unit includes a first memory chip group and a second memory chip group,
each of the first memory chip group and the second memory chip group comprises an equal number of stacked memory chips,
the first memory is a memory chip included in the first memory chip group, and
the second memory is a memory chip included in the second memory chip group.

12. The storage device of claim 2, wherein the first memory and the second memory are memory cells included in different planes of a single memory chip selected from among the plurality of memory chips included in the memory unit.

13. The storage device of claim 1, wherein the interface chip comprises a data retiming circuit transferring write data received from the memory controller to each of the first memory and the second memory, among the plurality of memory chips, in response to a clock signal having a predetermined frequency.

14. The storage device of claim 13, wherein the data retiming circuit comprises:
a clock generator generating the clock signal;
a serializer/deserializer receiving the write data from the memory controller; and
a first in, first out register configured to transfer the write data to the first memory and the second memory in response to the clock signal.

15. The storage device of claim 13, wherein the data retiming circuit receives even read data and odd read data from the first memory and the second memory and transfers read data generated from the even read data and the odd read data to the memory controller in response to the clock signal having the predetermined frequency.

16. The storage device of claim 13, wherein the interface chip further comprises a voltage conversion unit converting a driving voltage of the memory controller into a driving voltage level of the memory unit.

17. The storage device of claim 13, wherein the interface chip further comprises a mode setting unit for driving one of the data realignment circuit and the data retiming circuit.

18. The storage device of claim 17, wherein the mode setting unit comprises:
a mode decoder decoding a mode setting signal being input to output a mode selection signal; and
an operation mode and chip selector interfacing data communication between the memory controller and the memory unit by using one of the data realignment circuit and the data retiming circuit in response to the mode selection signal.

19. The storage device of claim 18, wherein the operation mode and chip selector comprises:
a die selection layer coupling selected memory chips to a channel, among the plurality of memory chips, in response to a chip enable signal received from the memory controller; and
an electrostatic discharge device providing electrostatic discharge protection between the memory controller and the memory unit during the data communication therebetween.

20. The storage device of claim 16, wherein the interface chip interfaces data communication between the memory controller and the memory unit by using one of the data realignment circuit and the data retiming circuit.

* * * * *